US007605672B2

(12) United States Patent
Kirkeby

(10) Patent No.: US 7,605,672 B2
(45) Date of Patent: Oct. 20, 2009

(54) INVERTED STYLE BALUN WITH DC ISOLATED DIFFERENTIAL PORTS

(75) Inventor: Niels H. Kirkeby, Jamesville, NY (US)

(73) Assignee: Anaren, Inc., East Syracuse, NY (US)

( * ) Notice: Subject to any disclaimer, the term of this patent is extended or adjusted under 35 U.S.C. 154(b) by 186 days.

(21) Appl. No.: 11/668,682

(22) Filed: Jan. 30, 2007

(65) Prior Publication Data

US 2007/0176707 A1 Aug. 2, 2007

Related U.S. Application Data

(63) Continuation-in-part of application No. 11/419,091, filed on May 18, 2006.

(60) Provisional application No. 60/764,715, filed on Feb. 2, 2006.

(51) Int. Cl.
*H03H 5/00* (2006.01)

(52) U.S. Cl. ......................... 333/26; 333/112; 333/118; 333/128; 333/136

(58) Field of Classification Search .................. 333/26, 333/128, 136, 112, 118
See application file for complete search history.

(56) References Cited

U.S. PATENT DOCUMENTS 3,835,421 A 9/1974 De Brecht et al.
5,075,648 A 12/1991 Roberts et al.
5,121,090 A 6/1992 Garuts et al.
6,018,277 A * 1/2000 Vaisanen ..................... 333/26
6,121,853 A * 9/2000 London ...................... 333/125
6,140,886 A * 10/2000 Fratti et al. ................... 333/26
6,208,220 B1 * 3/2001 Logothetis .................. 333/116
6,285,273 B1 * 9/2001 Morikawa ................... 336/200
6,294,965 B1 9/2001 Merrill et al.
6,359,528 B1 3/2002 Dao
6,483,415 B1 * 11/2002 Tang .......................... 336/200
6,529,099 B1 * 3/2003 Takenaka .................... 333/156
6,621,370 B1 9/2003 Dao
6,759,920 B1 * 7/2004 Cheung et al. ................ 333/25
6,819,199 B2 11/2004 Burns
6,952,142 B2 10/2005 Guitton et al.
7,081,800 B2 7/2006 He et al.
7,250,828 B2 * 7/2007 Erb ............................. 333/26
2002/0097107 A1 * 7/2002 Burns et al. ................... 333/26
2003/0042992 A1 3/2003 Frank
2004/0217823 A1 11/2004 Tayrani
2005/0088252 A1 * 4/2005 Burns et al. ................... 333/26
2006/0220760 A1 10/2006 Floyd et al.

OTHER PUBLICATIONS

Gerald Stevens; Patent Cooperation Treaty PCT International Search Report; International Searching Authority/US; Alexandria, VA, Aug. 25, 2008.
Gerald Stevens; Patent Cooperation Treaty PCT Written Opinion of the International Search Report; International Searching Authority/US; Alexandria, VA, Aug. 25, 2008.
Cussac, Yolaine; International Preliminary Report on Patentability (Chapter I of the Patent Cooperation Treaty); Sep. 16, 2008.
Stevens, Gerald; Written Opinion of the International Searching Authority; Aug. 18, 2008.

* cited by examiner

*Primary Examiner*—Vibol Tan
*Assistant Examiner*—Jason Crawford
(74) *Attorney, Agent, or Firm*—Daniel P. Malley; Bond, Schoeneck & King, PLLC

(57) ABSTRACT

The present invention is directed to a balun that includes a first coupler structure having a first port of a balanced port pair and an unbalanced port. A second coupler structure includes a second port of the balanced port pair. The second coupler port structure being connected to the first coupler structure such that the second port of the balanced port pair is DC isolated from the first port of the balanced port pair without decoupling components.

50 Claims, 15 Drawing Sheets

COUPLER CONFIGURATION

ODD MODE

EVEN MODE

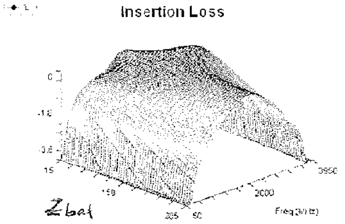

$$Z_o = \frac{\sqrt{Z_{bal} Z_{se}}}{4},\ Z_e = 1000$$

FIG. 17A-1

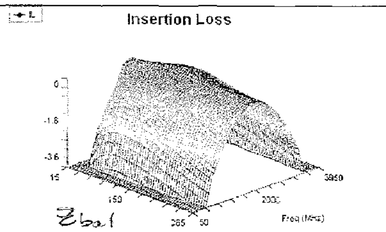

$$Z_o = \frac{\sqrt{Z_{bal} Z_{se}}}{4},\ Z_e = 3\sqrt{Z_{bal} Z_{se}}$$

FIG. 17A-2

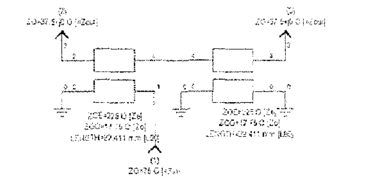

FIG. 17A-3

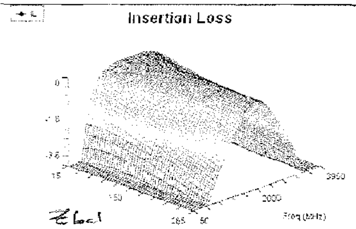

$$Z_o = \frac{\sqrt{Z_{bal} Z_{se}}}{4},\ Z_e = 1000$$

FIG. 17B-1

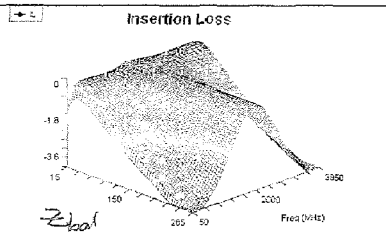

$$Z_o = \frac{\sqrt{Z_{bal} Z_{se}}}{4},\ Z_e = 3\sqrt{Z_{bal} Z_{se}}$$

FIG. 17B-2

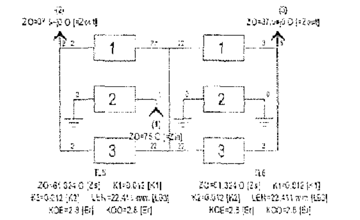

Notice this configurations very strong performance at 1:1 ratio, but at the same time limited flexibility

FIG. 17B-3

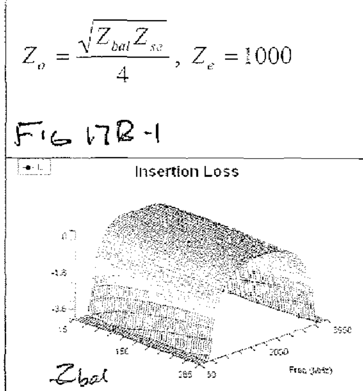

$$Z_o = \frac{\sqrt{Z_{bal} Z_{se}}}{4},\ Z_e = 1000$$

FIG. 17C-1

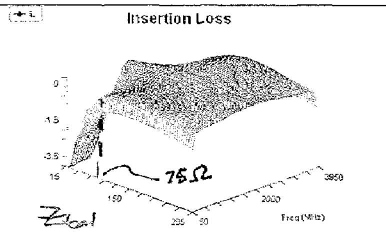

$$Z_o = \frac{\sqrt{Z_{bal} Z_{se}}}{4},\ Z_e = 3\sqrt{Z_{bal} Z_{se}}$$

FIG. 17C-2

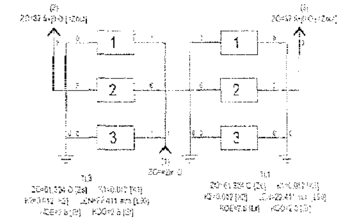

Notice the flexibility of this configuration with a high fixed even mode

FIG. 17C-3

$$Z_o = \sqrt{\frac{Z_{bal} Z_{se}}{12}}, \; Z_e = 1000$$

$$Z_o = \sqrt{\frac{Z_{bal} Z_{se}}{32}}, \; Z_e = \sqrt{2 Z_{bal} Z_{se}},$$

$$Z_o = \frac{\sqrt{Z_{bal} Z_{se}}}{4}, \; Z_e = 3\sqrt{Z_{bal} Z_{se}}$$

$$Z_o = \sqrt{\frac{Z_{bal} Z_{se}}{25}}, \; Z_e = \sqrt{2 Z_{bal} Z_{se}},$$

INVERTED STYLE BALUN WITH DC ISOLATED DIFFERENTIAL PORTS

CROSS-REFERENCE TO RELATED APPLICATIONS

This application is based on U.S. Provisional Patent Application No. 60/764,715 filed on Feb. 2, 2006, the content of which is relied upon and incorporated herein by reference in its entirety, and the benefit of priority under 35 U.S.C. §119(e) is hereby claimed, this application is a continuation-in-part of U.S. patent application Ser. No. 11/419,091 filed on May 18, 2006, the content of which is relied upon and incorporated herein by reference in its entirety, and the benefit of priority under 35 U.S.C. §120 is hereby claimed.

BACKGROUND OF THE INVENTION

1. Field of the Invention

The present invention relates generally to radio-frequency (RF) and/or microwave components, and particularly to RF and/or microwave coupled transmission line components.

2. Technical Background

Communication systems typically require a number of sub-systems and components to convert baseband signals into RF signals for subsequent transmission over a communication channel. Conversely, RF signals received via the communication channel must be converted into baseband signals for use by the user and/or subscriber. Examples of such systems are ubiquitous and include cell phones, cable television converters, satellite television converters, etc.

It is often the case wherein one stage of the communication system employs differential (i.e., balanced signals) signals and a subsequent stage unbalanced signals. A differential signal includes two signal paths, each being 180° out of phase with the other. An unbalanced line is simply implemented as a single signal path. For example, certain antennas are balanced structures that require a balanced feed. However, the system may be such that the signal source is an unbalanced RF transmitter. This situation may also present itself in the opposite direction as well. A push/pull amplifier, for example, may provide a balanced differential signal for subsequent use by an unbalanced antenna. As those of ordinary skill in the art will appreciate, a balun is typically used to couple a balanced signal source to an unbalanced load (e.g., an antenna) or vice-versa. The word "balun" is shorthand for a balanced-unbalanced network.

Baluns are typically implemented using several coupled transmission lines, i.e., directional couplers. Couplers are four-port passive devices that are commonly employed in radio-frequency (RF) and microwave circuits and systems. A coupler may be implemented by disposing two conductors in relative proximity to each other such that an RF signal propagating along a main conductor is coupled to a secondary conductor. The RF signal is directed into an input port connected to the main conductor and power is transmitted to an output port disposed at the distal end of the main conductor. An electromagnetic field is coupled to the secondary conductor and the coupled RF signal is directed into an output port disposed at an end of the secondary conductor. The output signals are, of course, 90° out of phase with each other. An isolation port is disposed at the other end of the secondary conductor. The term isolation port refers to the fact that, ideally, the RF signal is not available at this port. At the isolation port, the incident signal and the coupled signal are substantially out of phase with each other and cancel each other out.

Those of ordinary skill in the art will appreciate that balun performance, weight, form factor and volume are important issues for most implementations. One commonly known balun implementation is referred to as a Marchand balun. The Marchand balun includes a main half-wavelength transmission line coupled to two quarter-wavelength transmission lines. The unbalanced port is connected to the half-wavelength structure. The quarter-wavelength transmission lines provide the differential signal ports. Each differential signal port accommodates a signal that is equal in amplitude and opposite in phase to the other differential port. The Marchand balun is limited in that it supports wideband applications only when the unbalanced impedance is lower than the impedance of the balanced ports. Typical impedance transformation ratios are 1:2 or 1:4. A variation of the Marchand balun is known as the Merrill balun.

The Merrill balun may be thought of as an inverted Marchand balun because the balanced signals are provided at either end of the half-wavelength structure. The unbalanced port is disposed at one end of one of the quarter wavelength transmission lines. The other quarter wavelength transmission line is grounded at both ends. The half-wavelength structure and the quarter wavelength elements may be implemented using stripline segments formed by disposing a layer of conductive material on a dielectric substrate. While the performance of the Merrill balun, as measured by insertion loss and return loss over a predetermined bandwidth, is adequate, there are drawbacks associated with this balun implementation. The Merrill balun is limited in that it supports wideband applications only when the balanced impedance is less than or equal to the unbalanced impedance. For example, typical impedance transformation ratios are 1:1 or 2:1. This is another reason why Merrill baluns are referred to in some quarters as inverted Marchand baluns. In many designs, the electrical length and the even-mode impedance are essentially fixed, only the odd-mode impedance may be manipulated to optimize performance. One drawback of both the Marchand and Merrill baluns relates to the excessive line-widths of the stripline structures at certain odd-mode impedance values.

In certain applications, system designers are requiring that the balanced ports of the balun are isolated from each other and ground. In each of the examples discussed above, there are direct current (DC) paths between the balanced ports and/or ground. As those of ordinary skill in the art will understand, DC isolation is typically implemented by coupling the differential ports of the balun to the balanced signal source/sink via decoupling capacitors. Thus, size reductions may be realized if decoupling capacitors could be eliminated from the design.

What is needed is a balun implementation having an isolated balanced port while conforming to a desired form factor for a desired performance specification.

SUMMARY OF THE INVENTION

The present invention addresses the needs described above by providing an isolated balanced port while conforming to a desired form factor for a desired performance specification.

One aspect of the present invention is directed to a balun that includes a first coupler structure having a first port of a balanced port pair and an unbalanced port. A second coupler structure includes a second port of the balanced port pair. The second coupler structure is connected to the first coupler structure such that the second port of the balanced port pair is DC isolated from the first port of the balanced port pair without decoupling components.

In another aspect, the present invention is directed to a balun that includes a first coupler structure having a first port of a balanced port pair and an unbalanced port. A second coupler structure includes a second port of the balanced port pair. The second coupler structure is connected to the first coupler structure such that the first port of the balanced port pair and the second port of the balanced port pair are isolated from ground potential without decoupling components.

In yet another aspect, the present invention is directed to a device that includes a first coupler structure having a first portion of a first balanced port pair, a first portion of a second balanced port pair and an unbalanced port. A resistive element is connected to the first coupler structure. A second coupler structure includes a second portion of the first balanced port pair and a second portion of the second balanced port pair. The second coupler structure is connected to the first coupler structure by way of the resistive element such that the first and second portions of the first balanced port pair and the first and second portions of the second balanced port pair are isolated from ground potential without decoupling components.

In yet another aspect, the present invention is directed to a balun having a first coupler structure including a first port of a balanced port pair and an unbalanced port. The first coupler structure includes a first transmission line layer coupled to a second transmission line layer and a third transmission line layer coupled to the second transmission layer. The second transmission line layer is disposed between the first transmission line layer and the third transmission line layer. A second coupler structure includes a second port of the balanced port pair. The second coupler structure also includes a fourth transmission line layer coupled to a fifth transmission line layer and a sixth transmission line layer coupled to the fifth transmission layer. The fifth transmission line layer is disposed between the fourth transmission line layer and the sixth transmission line layer. The first transmission line layer is connected to the sixth transmission line layer and the third transmission line layer is connected to the fourth transmission line layer such that the first port of the balanced port pair is DC isolated from the second port of the balanced port pair.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention and are intended to provide an overview or framework for understanding the nature and character of the invention as it is claimed. The accompanying drawings are included to provide a further understanding of the invention and are incorporated in, and constitute a part of, this specification. The drawings illustrate various embodiments of the invention, and together with the description serve to explain the principles and operation of the invention.

BRIEF DESCRIPTION OF THE DRAWINGS

FIGS. 17A-17E are charts illustrating the design tradeoffs of the present invention relative to a Merrill balun;

DETAILED DESCRIPTION

Figure 1:
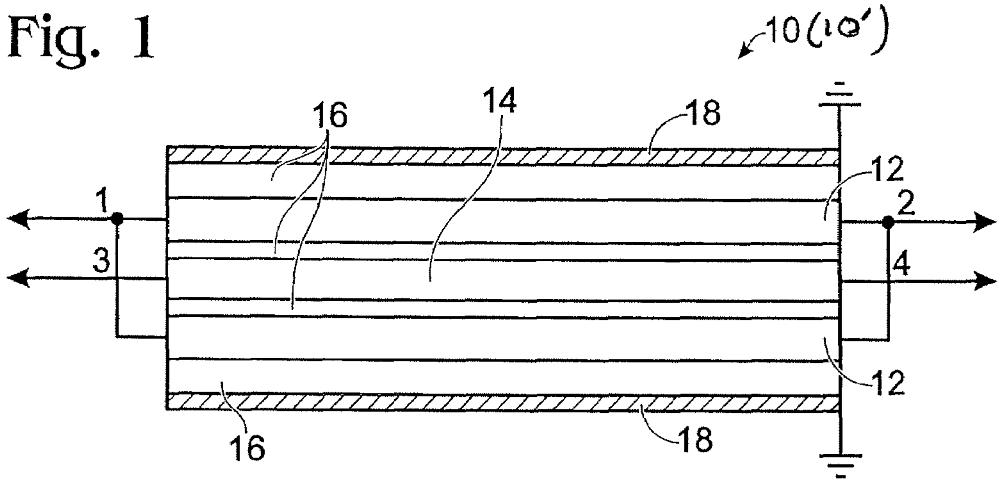
FIG. 1 is a schematic diagram of a vertical interdigital coupler in accordance with one embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. One embodiment of the balun of the present invention is shown in FIG. 6, and is designated generally throughout by reference numeral 100.

Figure 6:
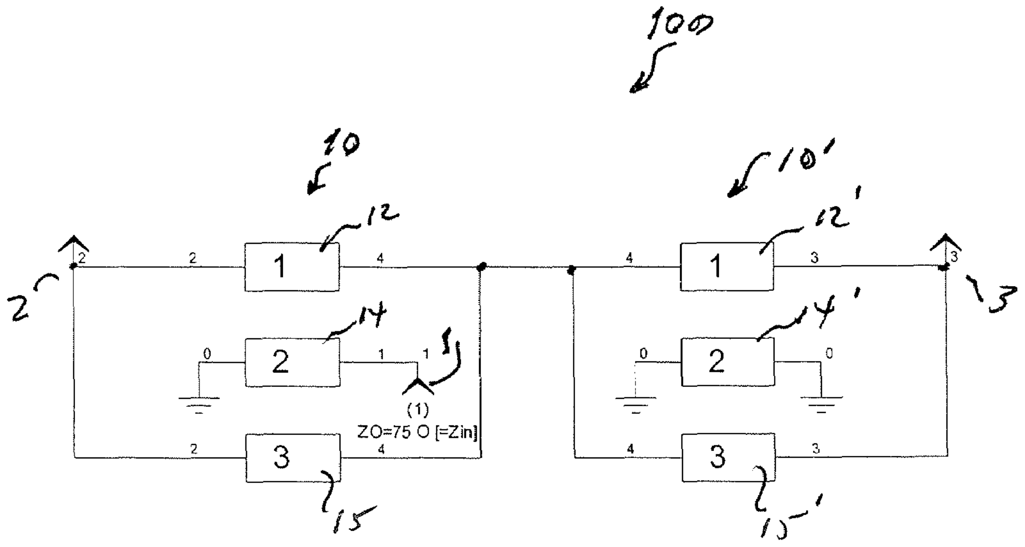
FIG. 6 is a balun in accordance with one embodiment of the present invention.

In accordance with the invention, initially referring to FIG. 6, the present invention for a balun 100 includes a coupler structure 10 having one port (2) of a balanced port pair and an unbalanced port (1). Another coupler structure 10' includes the second port (3) of the balanced port pair. Coupler structure 10' is connected to coupler structure 10 such that the balanced ports, i.e., port 2 and port 3 are DC isolated from each other without using any decoupling components. It will be apparent to those of ordinary skill in the pertinent alt that modifications and variations can be made to the coupler structures (10, 10') of the present invention depending on performance and form factor issues. For example, the coupler structures (10, 10') may be implemented using vertical interdigital couplers. In another embodiment, the coupler structures (10, 10') are implemented using edge couplers.

Referring back to FIG. 1, a schematic diagram of a cross-sectional portion of a vertical interdigital coupler 10 in accordance with one embodiment of the present invention is disclosed. While the reference numeral for the coupler structure employed in the following discussion is ten (10), the discussion equally applies to coupler 10' in balun 100. Coupler 10 is a vertical interdigital coupler that includes port 1, port 2, port 3, and port 4. In this embodiment, the vertical interdigital coupler includes three coupled transmission lines, i.e., transmission line 14 is interposed between two transmission lines 12. Each transmission line 12 is disposed on a dielectric substrate 16 and coupled between port 1 and port 2 to form a transmission line layer. Each of the transmission lines 14 are also disposed on a dielectric substrate 16 to form an adjacent transmission line layer. Transmission lines 14 are coupled between port 3 and port 4.

In general, vertical interdigital couplers may be implemented by disposing transmission line layers 14 in alternating layers with transmission line layers 12 to form a total of N transmission line layers. Transmission lines 12 and transmission lines 14 are disposed in a predetermined vertical position relative to each other. In one embodiment, transmission lines 12 may be vertically aligned with transmission lines 14 to effect maximum coupling. In other embodiment, transmission lines 14 are vertically offset from transmission lines 12 to obtain a different degree of coupling. In other words, the vertical geometric configuration may be adjusted to obtain a predetermined coupling constant. In accordance with the present invention, N is an integer value that is greater than or equal to three (3).

In the balun structure of the present invention, N is typically equal to three. N may be selected for a variety of reasons including coupling value, form factor considerations and etc. The alternating layers of transmission line layers 12 and transmission line layers 14 are typically disposed between a pair of ground plates 18. In certain embodiment, however, the ground plates 18 are unnecessary. Each second transmission line is disposed in a predetermined position relative to a corresponding first transmission line within the structure. However, those of ordinary skill in the alt will understand that the balun structures of the present invention should not be deemed as being limited to coupler structures having only three layers.

Figure 2:
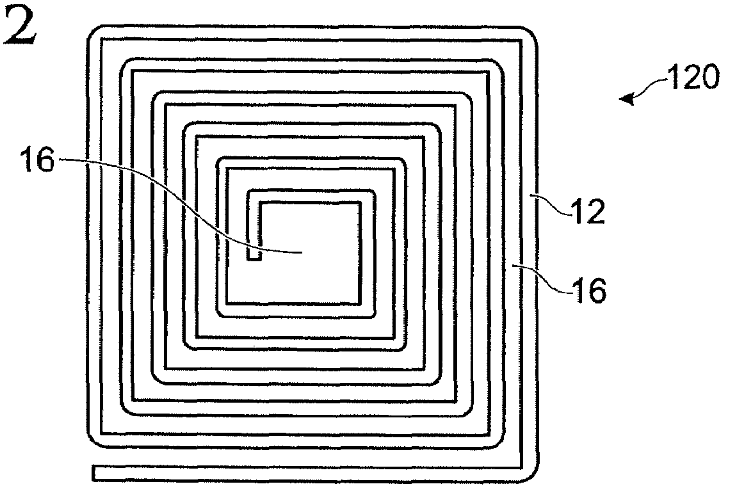
FIG. 2 is a plan view of a transmission line layer of a vertical interdigital coupler in accordance with the present invention.

Referring to FIG. 2, a plan view of a transmission line layer 12 is shown. FIG. 2 is equally applicable to line 14. As noted above, transmission lines 12, 14 are configured to conform to a predetermined geometric configuration. In this case, transmission line 12 is disposed in a folded square geometry. The length of transmission line 12 is approximately 68 mm. The geometric configuration, therefore, refers to the shape of the transmission line in plan view, the width of the conductors, the thickness of the conductors, the thickness of the dielectric, and all the various spacing dimensions. It will be apparent to those of ordinary skill in the pertinent art that modifications and variations can be made to predetermined geometric configuration of the present invention depending on the desired coupling and the specified volume/dimensional form factor requirements. In the illustrated example, transmission line 12 is disposed on substrate 16 in a folded square configuration. On the other hand, those of ordinary skill in the art will understand that the geometric configuration may be any suitable shape, such as linear, rectangular, non-linear, spiral or circular, and etc. The geometric pattern may include meandered line segments and other such geometries.

Figure 3A:
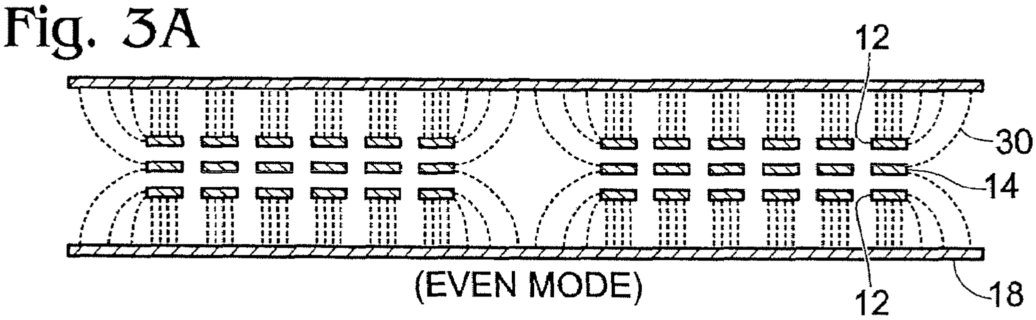
FIG. 3A-3B are diagrammatic depictions of the even mode and odd mode coupling field lines for the coupler depicted in FIG. 2.

FIG. 3A is a diagrammatic depiction of even mode coupling field lines for the coupler depicted in FIG. 2. As those of ordinary skill in the art will appreciate, even mode coupling refers to the scenario wherein transmission line 12 and transmission line 14 are at the same electrical potential. By definition, there is no coupling between transmission lines 12 and the transmission line 14 sandwiched therebetween. However, an electric field is established between transmission lines 12, 14 and the ground plates 18.

Figure 3B:
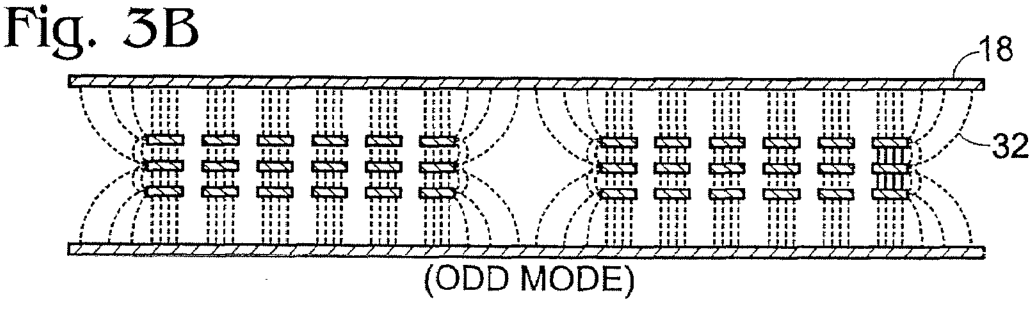

FIG. 3B is a diagram of the odd mode field lines. In the odd-mode, transmission lines 12 and transmission line 14 are at different potentials. Accordingly, an electric field is generated between transmission lines 12 and transmission line 14. FIGS. 3A-3B further illustrate that the arrangements depicted herein may be approximated as a parallel plate capacitor configuration. Thus, the capacitance is proportional to the area of the transmission line broad side, i.e., the length and width of the coupled broadside. FIG. 3B is noteworthy because it illustrates the improved coupling characteristics of the present invention relative to conventional devices. Note that transmission line 14 is coupled to transmission lines 12 from both sides of the transmission line.

Those of ordinary skill in the art will understand that three layer structures are inherently asymmetrically coupled devices. Therefore, the use of Even and Odd mode impedances herein is a simplified approximation of the asymmetric nature of the vertical interdigital coupler structures. However, those of ordinary skill in the art will also understand that using asymmetric mathematical models to explain the present invention overly, and significantly, complicates the disclosure with very limited benefit. In fact, those of ordinary skill in the art will understand that the compact structural designs disclosed herein must be finalized using three-dimensional (3D) electromagnetic simulators whether asymmetrical or symmetrical models are employed.

Figure 4:
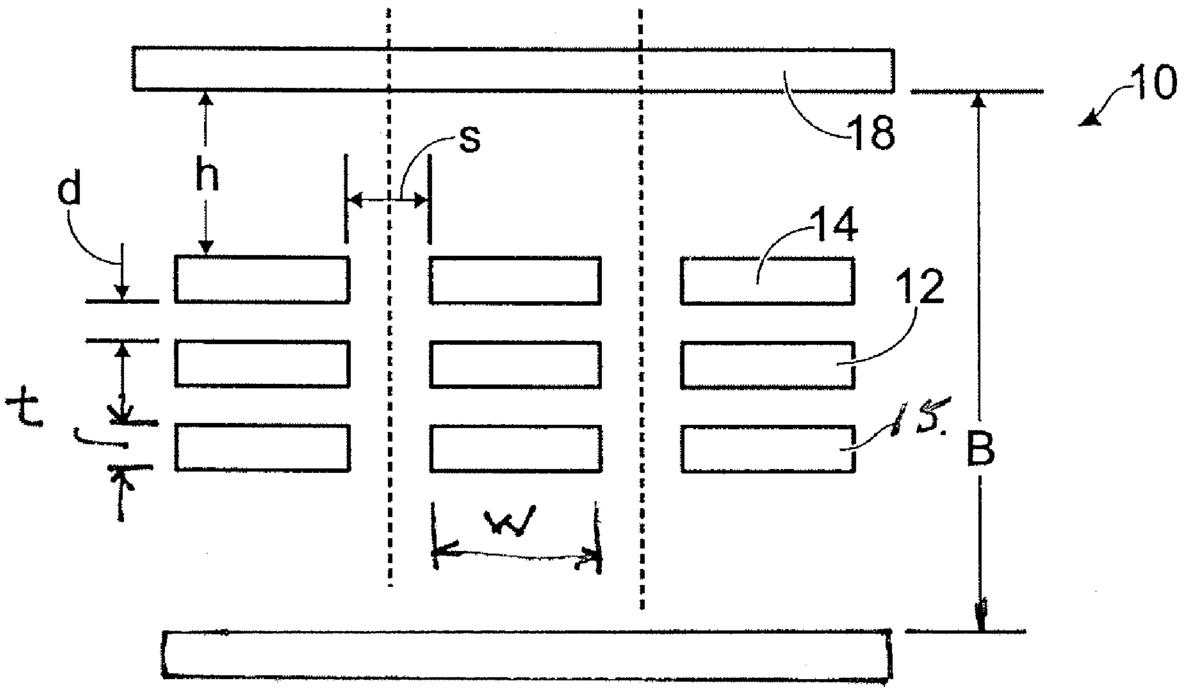
FIG. 4 is a diagram illustrating the coupler cross-sectional area in accordance with the present invention.

FIG. 4 is a diagram showing coupler cross-sectional design considerations in accordance with the present invention. As noted previously, the vertical interdigital broadside coupler 10 may be miniaturized and engineered to be disposed in a physical form factor having predetermined dimensional specifications. In the example provided, there are three vertically broadside coupled transmission lines 12, 14, and 15, i.e., N=3. Dimension d is the vertical distance between broadside coupled transmission lines 12, 14, 15. Dimension h is the vertical distance from each outermost conductor 14 to the closest ground plane 18 (if present). Dimension t is the vertical height of each conductor 12, 14. Dimension s is the horizontal spacing between adjacent segments in a given transmission line conductor. Dimension w is the width of each conductor, i.e., the dimension in the horizontal plane of FIG. 4. Finally, m is the ratio between conducting and non-conducting material in the horizontal direction, wherein:

$$m \approx \frac{w}{w+s} \tag{2}$$

The total ground plane spacing of the stripline structure, not including conductor thickness is:

$$b_N = 2h + (N-1)d \tag{3}$$

The total ground plane spacing of the stripline structure including the conductor thickness is:

$$B_N = 2h + (N-1)d + Ntm \tag{4}$$

The cross sectional area occupied by a coupled section is therefore:

$$A_N = B_N(s+w) = (s+w)(2h + (N-1)s + Ntm) \tag{5}$$

Equation (5) is an approximation that assumes that the structure has an electrical wall interposed between each vertical conductor group. This approximation is reasonable for tightly spiraled structures with X-Y dimension much smaller than one quarter wavelength (λ/4). Thus, the capacitances can be approximated to that of parallel plate capacitance:

$$C_P = \varepsilon_0 \varepsilon_r \frac{lw}{d_{CP}} \tag{6}$$

The dimension l is the length of the transmission lines and $d_{CP}$ is the distance between the plates.

$$\text{If } C_x = \varepsilon_0 \varepsilon_r lw, \text{ [Fm]} = 8.854 \varepsilon_r lw, \text{ [pFm]}, \tag{7}$$

$$\text{then; } C_P = \frac{C_x}{d_{cp}}. \tag{8}$$

$C_x$ is employed in the even and odd mode capacitance equations derived herein. Those of ordinary skill in the art will understand that the constants $\in_0$ and $\in_r$ in equation (7) refer to the permittivity of the dielectric material. Permittivity is a measure of a dielectric material's response to an applied electric field. In particular, if the permittivity of a first dielectric material is larger than the permittivity of a second dielectric material, the first material will store a greater charge for a given applied electric field. As equation (7) suggests, permittivity is proportional to capacitance. Thus, the first dielectric material will have a greater capacitance. Note also that $\in_0$, the permittivity of free space is $8.8541878176 \times 10^{-12}$ farads per meter (F/m). Hence, [pFm] is used to denote "pico Farads per meter" in equation (7).

Figure 5A:
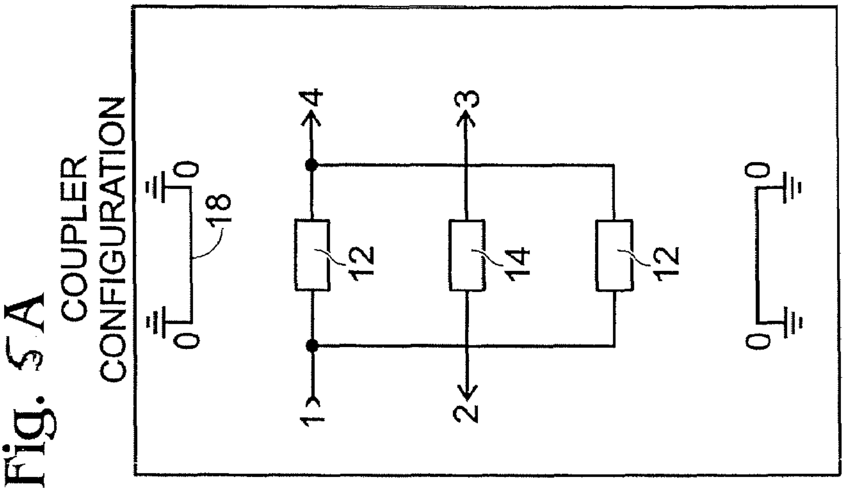
FIGS. 5A-5C are schematic diagrams illustrating vertical interdigital coupler design considerations.
Figure 5B:
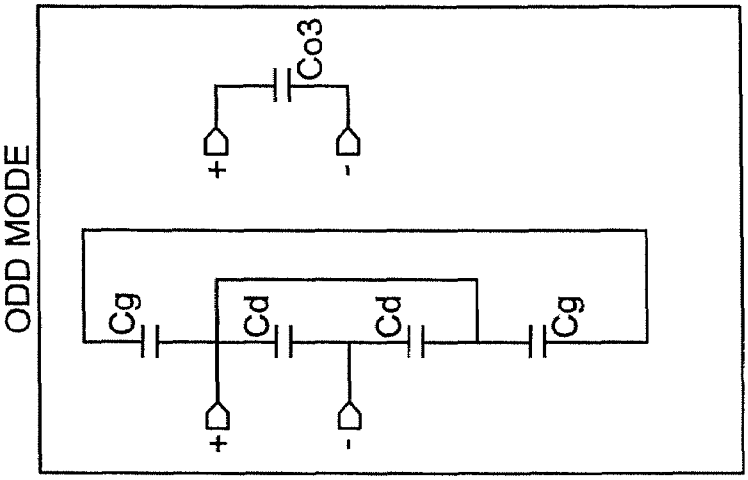
Figure 5C:
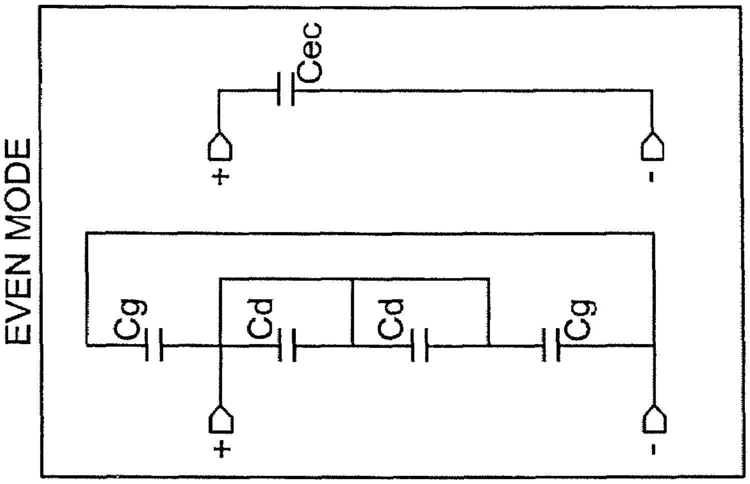

FIGS. 5A-5C are schematic diagrams illustrating vertical interdigital coupler design considerations in accordance with a three-layer embodiment of the present invention. FIG. 5B is a schematic showing equivalent odd-mode capacitances for the three layer coupler design of the present invention. FIG. 5C is a schematic showing the equivalent even-mode capacitances.

$$C_{o3} = 2C_d = \frac{2C_x}{d} \tag{13}$$

Note that the odd-mode capacitance does not depend on the strip line height. This implies that the stripline ground planes may be removed without any adverse consequences (relative to the odd mode). In other words, this design is an approximation of a coax cable. Also of note is that the even-mode capacitance is identical to the conventional 2-layer broadside coupler. In fact, the even-mode capacitance does not depend on the value of N.

As embodied herein and depicted in FIG. 6, a balun 100 in accordance with one embodiment of the present invention is disclosed. Coupler structure 10 includes coupled transmission line layers 12, 14, and 15. Transmission line layer 14 is disposed between transmission line layer 12 and transmission line layer 15. Coupler structure 10' is very similar to coupler structure 10. It includes coupled transmission line layers 12', 14' and 15'. Transmission line layer 14' is sandwiched between the transmission line layer 12' and transmission line layer 15'. Balun 100, of course, includes an unbalanced port 1 and a balanced port. The balanced port further includes "in-phase" port 2 and "quadrature phase" port 3. The terms in-phase and quadrature, as used herein, merely refer to the fact that port 2 and port 3 support signals that are of substantially equal in amplitude and 180° out of phase with each other. On the other hand, the terms "in-phase" and "quadrature", as used herein, do not necessarily mean that the in-phase port is substantially in phase with the unbalanced port 1. In fact, in various embodiments, the in-phase port may be +90° out of phase with the unbalanced port whereas the quadrature port may be −180' out of phase with the unbalanced port. The present invention should not be construed as being limited to any of these examples.

In-phase port 2 is connected to transmission line layer 12 and transmission line layer 15. Quadrature port 3 is connected to transmission line layer 12' and transmission line layer 15'. The internal ends of coupler 10 transmission lines (12, 15) are connected to the internal ends of coupler 10' transmission lines (12', 15'). One end of transmission line 14 is connected to the unbalanced port and the other end is connected to ground. Transmission line 14' is grounded at both ends. In this way, the coupler structure 10 is interconnected with coupler structure 10' such that in-phase port 2 and quadrature port 3 are isolated from ground potential without decoupling components. Both coupler structures (10, 10') as shown in FIG. 6 are implemented as vertical interdigital broadside couplers. However, those of ordinary skill in the art will understand that the balun 100 may also be implemented using edge coupled coupler structures.

Figure 7:
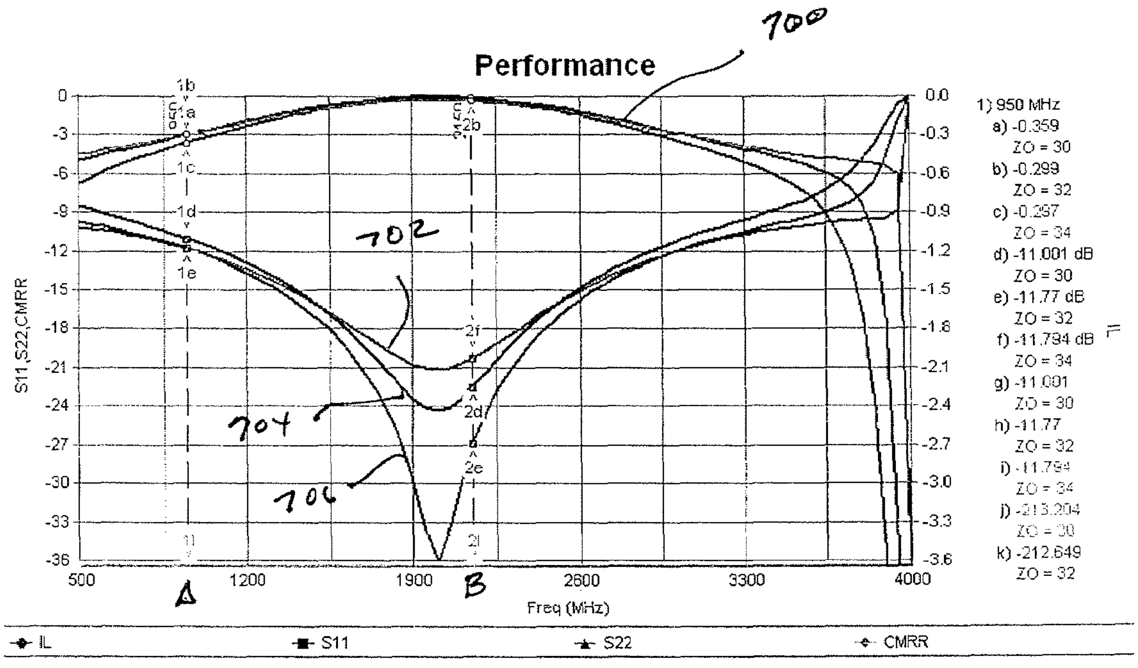
FIG. 7 is a chart illustrating the performance of the balun depicted in FIG. 6.

Referring to FIG. 7, a chart illustrating the performance (insertion loss and return loss) of the balun 100 depicted in FIG. 6 is disclosed. From the discussion of the vertical interdigital coupler disclosed earlier (See, for example, FIG. 4), it becomes apparent that the finite even-mode impedance ($Z_e$) is largely dependent on device dimensions h, B. In the examples shown in FIG. 7, the finite even-mode impedance ($Z_e$) is kept relatively constant—the device profile remains the same for each measurement. The finite odd-mode impedance ($Z_o$), on the other hand, is mostly dependant on dimensions d, w, s, and t. The example insertion loss and return loss curves shown in FIG. 7 are a function of the finite odd-mode impedance ($Z_o$).

As shown in the chart, the bandwidth of interest is between point A (950 MHz) and point B (2100 MHz). The insertion loss curves 700 within the specified bandwidth varies from −4 dB at 950 MHZ to approximately 0 dB at 2100 MHz. In this example, an acceptable return loss must be −12 dB or better. Return loss curve 702 corresponds to a finite odd-mode impedance ($Z_o$) of 34Ω. In the bandwidth region at or near 950 MHz, the return loss is approximately −11 dB, and therefore, the design is unacceptable. Return loss curve 704 and 706 correspond to a finite odd-mode impedance ($Z_o$) of 30Ω and 32Ω respectively, and represent an improvement over curve 702. However, both show marginal performance in the 950 MHz region.

Figure 8:
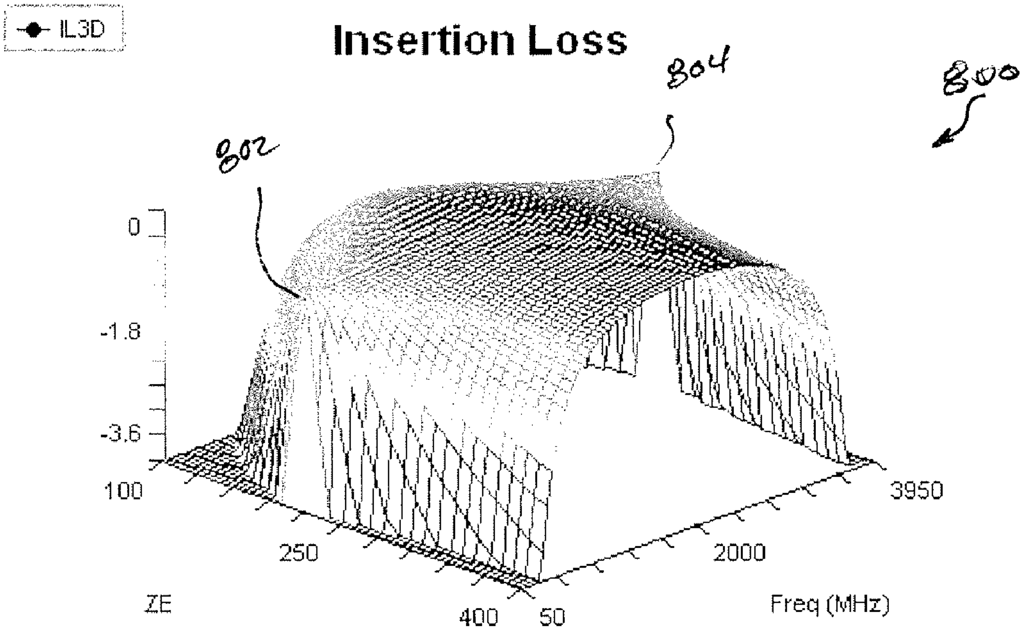
FIG. 8 is a chart illustrating the insertion loss of the balun depicted in FIG. 6 as a function of frequency and even-mode impedance.

Referring to FIG. 8, a chart illustrating the insertion loss of the balun depicted in FIG. 6 as a function of frequency and even-mode impedance is disclosed. The odd-mode impedance is fixed at 37.5 Ohms. In this embodiment, the three-dimensional graph 800 shows quite clearly that the bandwidth is narrow at lower values of the even-mode impedance. The bandwidth reaches a maximum point at about 225 Ohms. Those of ordinary skill in the art will again understand that the profile height of device 100 (FIG. 6) is proportional to the finite even-mode impedance. At this point, the bandwidth extends between point 802 and point 804. As even-mode impedance increases, the bandwidth begins to experience a decline.

Figure 9:
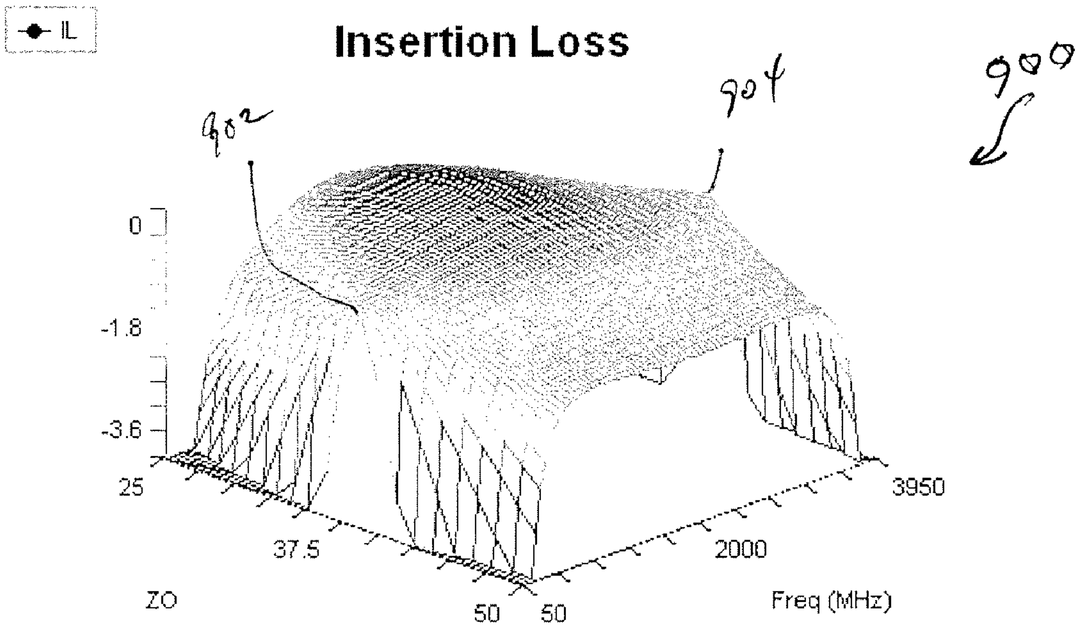
FIG. 9 is a chart illustrating the insertion loss of the balun depicted in FIG. 6 as a function of frequency and odd-mode impedance.

Referring to FIG. 9, a chart illustrating the insertion loss of the balun depicted in FIG. 6 as a function of frequency and odd-mode impedance is disclosed. In FIG. 9, the even-mode impedance is fixed at 225 Ohms. The bandwidth of the balun shown in FIG. 6 is limited for smaller values of the odd-mode impedance. However, as shown by points (902, 904), the bandwidth is at a maximum at about 37.5 Ohms. Once the odd-mode impedance increases beyond approximately 42 Ohms, the bandwidth again begins to decrease.

Figure 10:
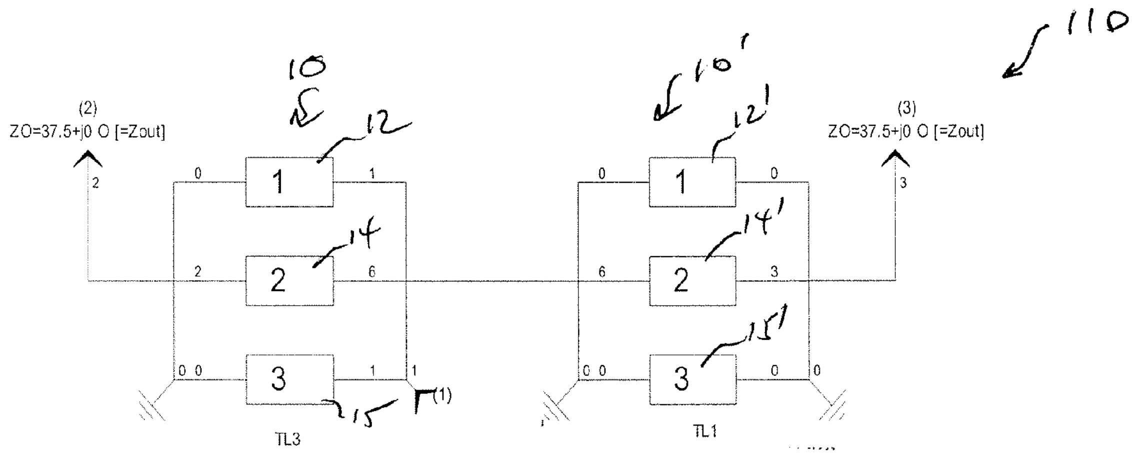
FIG. 10 is a balun in accordance with another embodiment of the present invention.

As embodied herein and depicted in FIG. 10, a balun in accordance with yet another embodiment of the present invention is disclosed. A balun 110 in accordance with another embodiment of the present invention is disclosed. This structure is similar to the device depicted in FIG. 6 in that the balanced port is isolated from ground potential. Coupler structure 10 includes coupled transmission line layers 12, 14, and 15. Transmission line layer 14 is disposed between transmission line layer 12 and transmission line layer 15. Coupler structure 10' is very similar to coupler structure 10. It includes coupled transmission line layers 12', 14' and 15'. Transmission line layer 14' is sandwiched between the transmission line layer 12' and transmission line layer 15'. Balun 110, of course, includes an unbalanced port 1 and a balanced port including in-phase port 2 and quadrature phase port 3. The terms in-phase and quadrature, as used herein, merely refer to the fact that port 2 and port 3 accommodate signals that are of substantially equal in amplitude and 180° out of phase with each other.

Unlike the previous embodiment, transmission line layer 12 is connected to transmission line layer 15 and transmission line layer 12' is also connected to the transmission line layer 15'. The in-phase port (2) is connected to transmission line layer 14 and quadrature port (3) is connected to transmission line layer 14'. Further, the internal ends of transmission line layer 14 and transmission line layer 14' are connected to each other. Transmission line layer 12 and transmission line layer 15 have an outer end connected to ground potential and an internal end connected to the unbalanced port. Transmission line layer 12' and transmission lines layer 15' are connected to ground potential at both ends.

Figure 11:
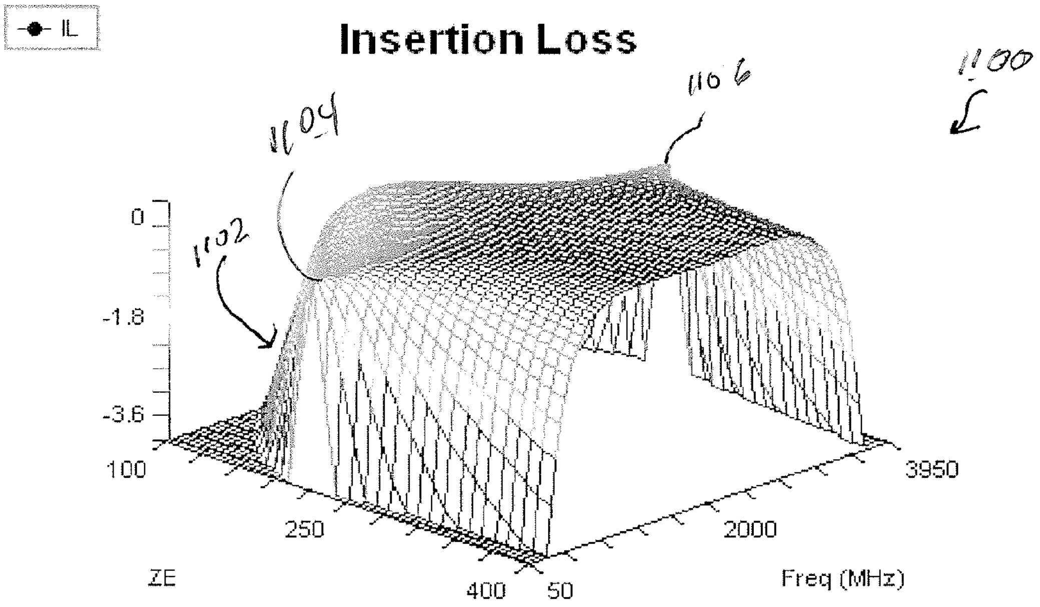
FIG. 11 is a chart illustrating the insertion loss of the balun depicted in FIG. 10 as a function of frequency and even-mode impedance.
Figure 12:
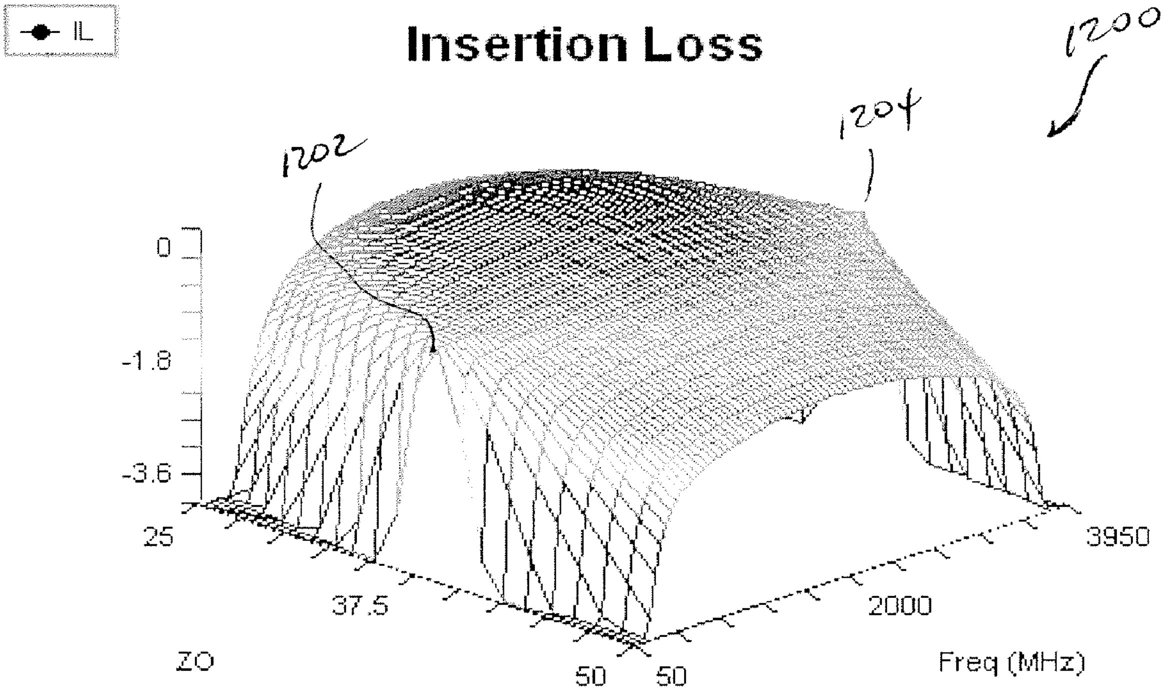
FIG. 12 is a chart illustrating the insertion loss of the balun depicted in FIG. 10 as a function of frequency and odd-mode impedance.

Referring to FIG. 11 and FIG. 12, the insertion loss performance of the balun depicted in FIG. 10 is illustrated. FIG. 11 shows the insertion loss of the balun 110 as a function of frequency and even-mode impedance. The odd-mode impedance is fixed at 37.5 Ohms. The balun is configured as a 75:75 Ohm balun. The performance of balun 110 is very similar to balun 100 (FIG. 6). At lower values of even-mode impedance, characterized by region 1102, the bandwidth provided by balun 110 is quite narrow. The available bandwidth of device 110 increases as even-mode impedance increases, until the bandwidth reaches a maximum at about 225 Ohms. Of course, the maximum bandwidth extends between points 1104 and 1106. Those of ordinary skill in the art will understand that the device best operates, from an even mode standpoint, at about 225 Ohms. Accordingly, any attempt to lower the device profile, such that even-mode impedance is driven below the 225-250 Ohm region, will result in severe bandwidth degradation.

FIG. 12 is a chart illustrating the insertion loss of the balun depicted in FIG. 10 as a function of frequency and odd-mode impedance. The even-mode impedance is fixed at 225 Ohms. The insertion loss experienced by balun 110 at either end of the spectrum (50 MHz, 3950 MHz) tails off for smaller values of the odd-mode impedance. However, the bandwidth reaches a maximum between points 1202 and 1204. The maximum corresponds to an odd-mode impedance of about 37.5 Ohms. Once the odd-mode impedance starts to increase beyond the maximum, the insertion loss as a function of frequency begins to decrease.

Figure 13:
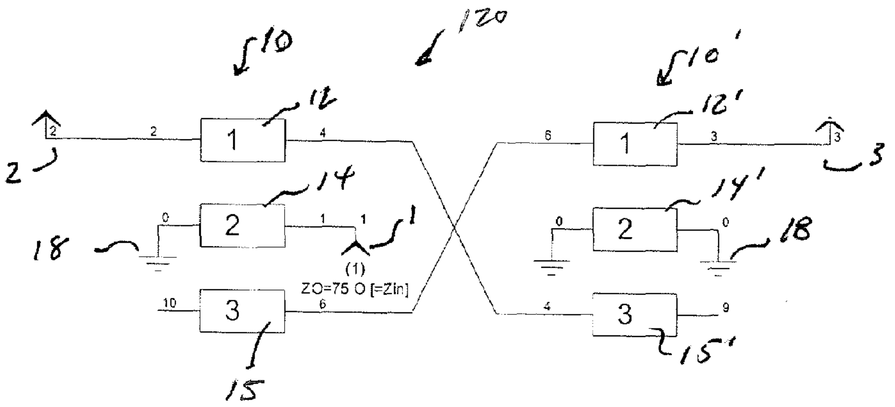
FIG. 13 is a balun in accordance with yet another embodiment of the present invention.

As embodied herein and depicted in FIG. 13, a balun 120 in accordance with another embodiment of the present invention is disclosed. Coupler structure 10 includes coupled transmission line layers 12, 14, and 15. Transmission line layer 14 is disposed between transmission line layer 12 and transmission line layer 15. Coupler structure 10' is very similar to coupler structure 10. It includes coupled transmission line layers 12', 14' and 15'. Transmission line layer 14' is disposed between the transmission line layer 12' and transmission line layer 15'. Balun 120 includes an unbalanced port 1 and a balanced port including in-phase port 2 and quadrature phase port 3. The terms in-phase and quadrature, as used herein, merely refer to the fact that port 2 and port 3 accommodate signals that are of substantially equal in amplitude and 180° out of phase with each other.

In this embodiment, in-phase port 2 is only connected to transmission line layer 12. In similar fashion, quadrature port 3 is only connected to transmission line layer 12'. The internal end of coupler 10 transmission line 12 is connected to the internal end portion of transmission layer 15' and the internal end of transmission layer 15 is connected to the internal end of transmission line layer 12'. One end of transmission line 14 is connected to the unbalanced port and the other end is connected to ground. Transmission line 14' is grounded at both ends. As shown in FIG. 13, coupler structure 10 is interconnected with coupler structure 10' such that in-phase port 2 is DC isolated from quadrature port 3 without any decoupling components, such as capacitors or other such components typically employed.

Both coupler structures (10, 10') as shown in FIG. 13 are implemented as vertical interdigital broadside couplers. However, those of ordinary skill in the art will understand that the balun 100 may also be implemented using edge coupled coupler structures.

Figure 14:
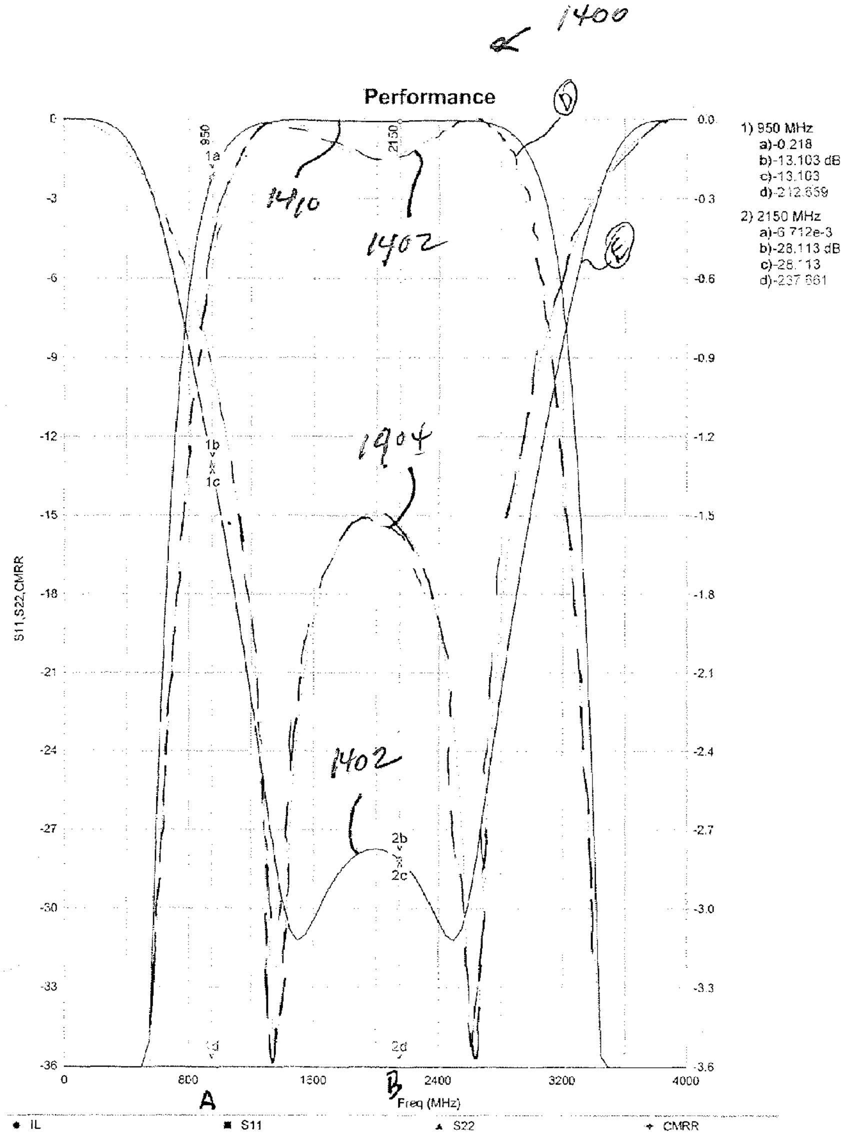
FIG. 14 is a chart illustrating the performance of the balun depicted in FIG. 13.

Referring to FIG. 14, a chart 1400 illustrating the performance of balun 120 (FIG. 13) is disclosed. Again, the bandwidth of interest is between point A (950 MHz) and point B (2100 MHz). Chart 1400 shows two device examples, each having different finite odd-mode impedance ($Z_o$) values. The first device is represented by insertion loss curve 1402 and return loss curve 1404. The second device is represented by insertion loss curve 1410 and return loss curve 1412. As before, an acceptable return loss must be −12 dB or better. The insertion loss 1402 of the first device is uneven over the specified bandwidth. In the 950 MHz region the insertion loss exceeds −3 dB and is, therefore, unacceptable. The insertion loss 1402 is similarly degraded in the region approaching 2150 MHz. The return loss curve 1404 is also problematic in the 950 MHz region. However, by adjusting the finite odd-mode impedance ($Z_o$) in the second example, the insertion loss curve 1410 and the return loss curve show marked improvement over the first example. The insertion loss 1410 is substantially flat over the entire bandwidth. The return loss 1412 is greater than −12 dB for the entire bandwidth.

Figure 15:
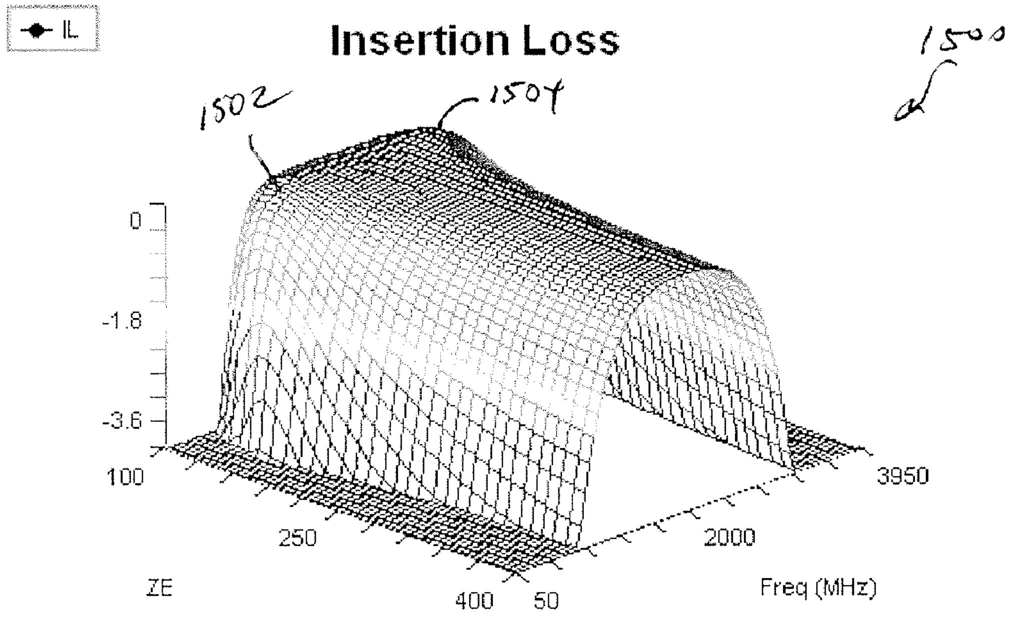
FIG. 15 is a chart illustrating the insertion loss of the balun depicted in FIG. 13 as a function of frequency and even-mode impedance.

Referring to FIG. 15, a chart illustrating the insertion loss of balun 120 (FIG. 13) as a function of frequency and even-mode impedance is shown. Unlike previous embodiments, the insertion loss is at a minimum and the bandwidth at a maximum for smaller values of the even-mode impedance. In fact, the even-mode impedance at the balun "sweet-spot" is approximately one-half that of the previous balun embodiments (100, 110). Accordingly, balun 120 represents a significant improvement from a device profile reduction standpoint.

Figure 16:
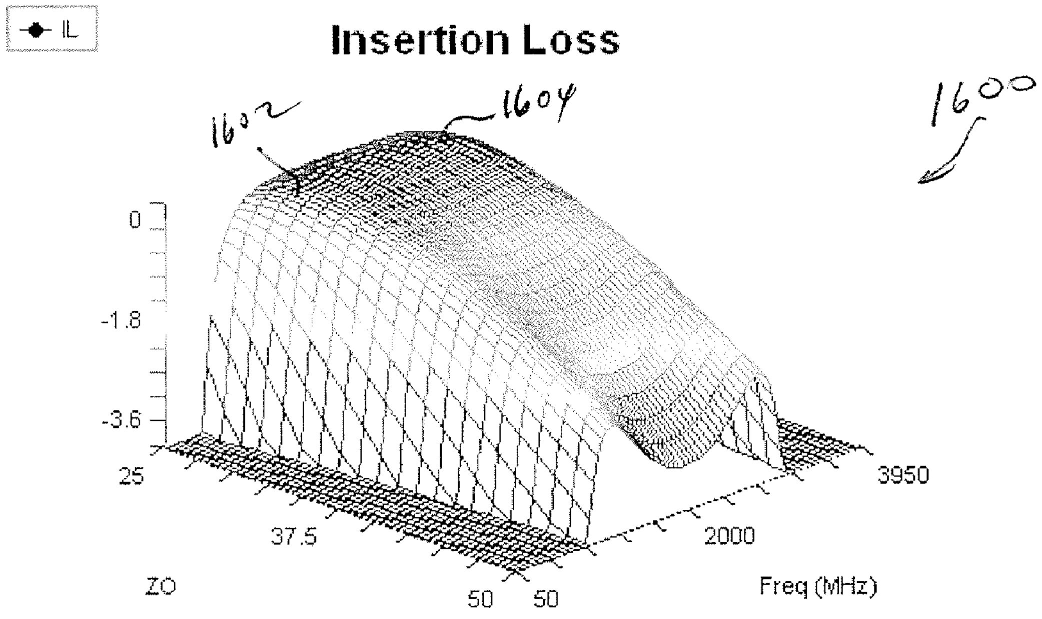
FIG. 16 is a chart illustrating the insertion loss of the balun depicted in FIG. 13 as a function of frequency and odd-mode impedance.

FIG. 16 is a chart illustrating the insertion loss balun 120 as a function of frequency and odd-mode impedance. The maximum bandwidth extends between points 1602 and 1604. The odd-mode impedance at this point is approximately 30 Ohms.

In reference to the insertion loss charts shown in FIGS. 8, 9, 12, 12, 15, and 16, it becomes apparent that the novel three (3) coupled transmission line balun structures of the present invention represent an improvement over the related art. For example, in a two (2) coupled transmission line Merrill balun, the even mode requirement is reduced from initially infinite to $Z_e=3\sqrt{Z_{bal}Z_{se}}$ and further reduced to $Z_e=\sqrt{2Z_{bal}Z_{se}}$, or a factor of $\sqrt{9}/\sqrt{2}\approx 2$. The trade-off is an increase in the odd-mode impedance. However, the penalty is relatively small. The increased odd mode impedance is at a rate of only $\sqrt{2}$.

Referring to FIGS. 17A-17E, charts illustrating the transformation ratio tradeoffs of the present invention relative to a Merrill balun are disclosed. In the Examples provided below, each chart is given an alpha-numeric designation. The letter designation corresponds to the balun type. For each letter designation, one (1) corresponds to a chart showing the insertion loss as a function of the balanced impedance ($Z_{bal}$) and frequency for a relatively high even-mode impedance ($Z_e$). The high value of the even-mode impedance ($Z_e$) approximates infinity. The reader will also recognize that the odd-mode impedance ($Z_o$) is constant in all of the examples. Of course, in all of the examples provided, the even-mode impedance ($Z_e$) and the odd-mode impedance ($Z_o$) are a function of the balanced impedance ($Z_{bal}$) and the single ended impedance ($Z_{se}$).

FIG. 17A-1 illustrates the insertion loss of a Merrill balun (FIG. 17A-3) with the even-mode impedance ($Z_e$) being set at 1000. The insertion loss of the Merrill balun is acceptable at $Z_{bal}=75$ Ohms. In FIG. 17A-2, the even-mode impedance ($Z_e$) is reduced to three-times the geometric mean of the balanced impedance ($Z_{bal}$) and the single ended impedance ($Z_{se}$), i.e., $Z_e=3\sqrt{Z_{bal}Z_{se}}$. As shown, the reduction impairs the performance of the device at 75 Ohms. As the balanced impedance increases, the insertion loss as a function of frequency decreases.

FIG. 17B-1 illustrates the insertion loss of a balun 100 (See FIG. 6, FIG. 17B-3) with the even-mode impedance ($Z_e$) being set at 1000. In FIG. 17B-2, the even-mode impedance ($Z_e$) is again reduced. The reduction of the even-mode impedance results in an improved wide-band performance of the device at 75 Ohms. Thus, the performance of this embodiment is very strong at a 1:1 transformation ratio. However, as the balanced impedance increases, the insertion loss as a function of frequency deteriorates rapidly.

FIG. 17C-1 illustrates the insertion loss of a balun 110 (See FIG. 10, FIG. 17C-3) with the even-mode impedance ($Z_e$) again being set at 1000. In FIG. 17C-2, the even-mode impedance ($Z_e$) is again reduced. The performance of balun 110 shows remarkable flexibility. The insertion loss remains relatively flat as the balanced impedance ($Z_{bal}$) increases.

Figures 1, 17D:
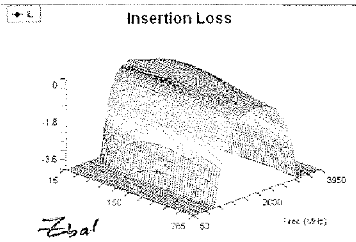
Figures 2, 17D:
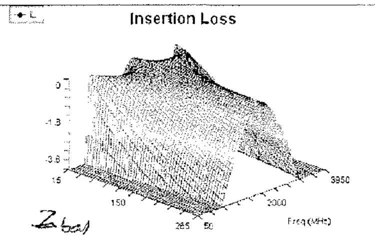
Figures 3, 17D:
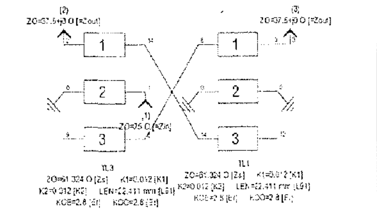
Figures 1, 17E:
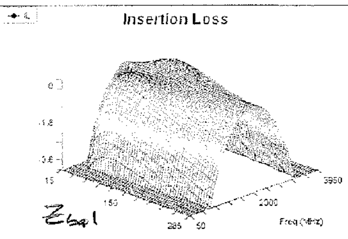
Figures 2, 17E:
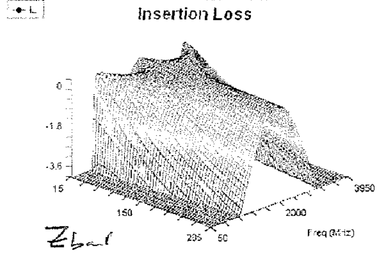
Figures 3, 17E:
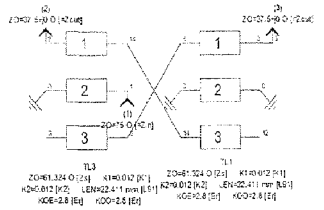

FIG. 17D-1 illustrates the insertion loss of a balun 120 (See FIG. 13, FIG. 17D-3) with the even-mode impedance ($Z_e$) again being set at 1000. However, in this example, the odd-mode impedance is three (3) times smaller that the previous examples. The performance of the device at these even-mode impedance and odd-mode impedance values is degraded with respect to the previous examples. At 75 Ohms, the bandwidth is relatively constricted. In FIG. 17D-2, the odd-mode impedance is further reduced and the even-mode impedance is reduced by more than half of the value of the previous examples (i.e., FIGS. 17A-2, 17B-2, 17C-2). According to FIG. 17D-2, balun 120 exhibits relatively good performance in the 75 Ohm region. The significance of this result becomes clear by comparing FIG. 17B-2 with FIG. 17D-2. Balun 120 (FIG. 13, 17D-2) may be employed to obtain comparable results while reducing the device profile height in half relative to balun 100 (FIG. 6). FIGS. 17E-1 and 17E-2 are additional illustrations of the performance of balun 120 (See FIG. 13, FIG. 17D-3). Comparing FIG. 17D-2 with FIG. 17E-2, it becomes apparent that device 120 (FIG. 13) represents a significant reduction in device size relative to the other embodiments, while at the same time, providing acceptable performance in the 75 Ohm region.

Figure 18:
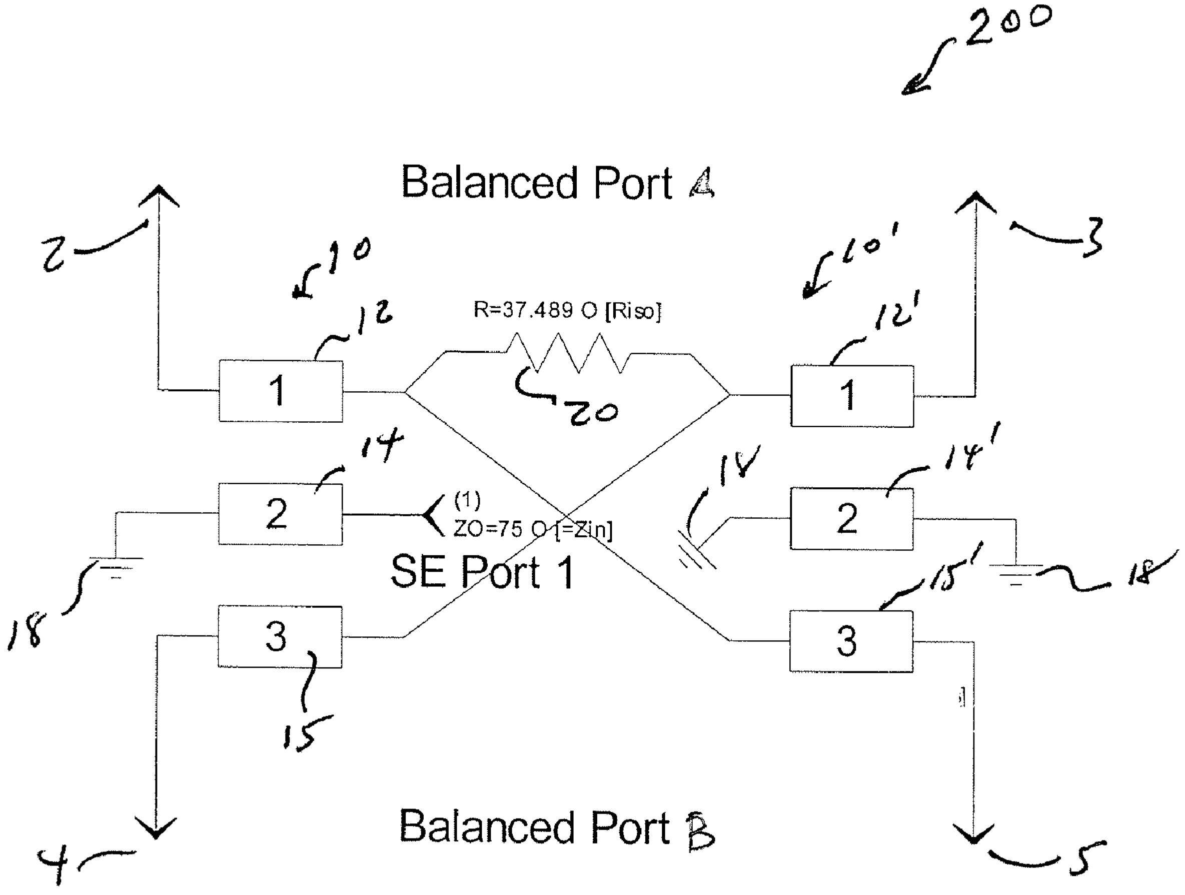
FIG. 18 is a power divider in accordance with another embodiment of the present invention.

As embodied herein and depicted in FIG. 18, a power divider 200 in accordance with another embodiment of the present invention is disclosed. In this embodiment, both coupler structure 10 and coupler structure 10' are identical to the coupler structures shown FIG. 8. The power divider 200 is implemented by connecting a resistor 20 between coupler 10' and coupler structure 10'.

Power divider structure 200 is formed by connecting resistor element 20 between transmission line layer 12 and transmission line layer 12'. Transmission line 12 is also internally connected to an end portion of transmission layer 15' and the internal end of transmission layer 15 is similarly connected to the internal end of transmission line layer 12'. One end of transmission line 14 is connected to the unbalanced port and the other end is connected to ground. Transmission line 14' is grounded at both ends.

Power divider 200 includes unbalanced port 1, balanced port A and balanced port B. Balanced port A includes in-phase port 2 connected to transmission line layer 12 and quadrature phase port 3 connected to transmission line layer 12'. Balanced port B includes in-phase port 4 connected to transmission line layer 15 and quadrature phase port 5 connected to transmission line layer 15'. Again, the terms in-phase and quadrature, as used herein, merely refer to the fact that port 2 and port 3 accommodate signals that are of substantially equal in amplitude and 180° out of phase with each other. In any event, the signal directed into the unbalanced port 1 is divided between balanced port A and balanced B. In one embodiment, the signal provided to the unbalanced port 1 is split equally between the two balanced ports (A, B). However, those of ordinary skill in the art will understand that the signal may be split unequally in accordance with any desired ratio.

Figure 19:
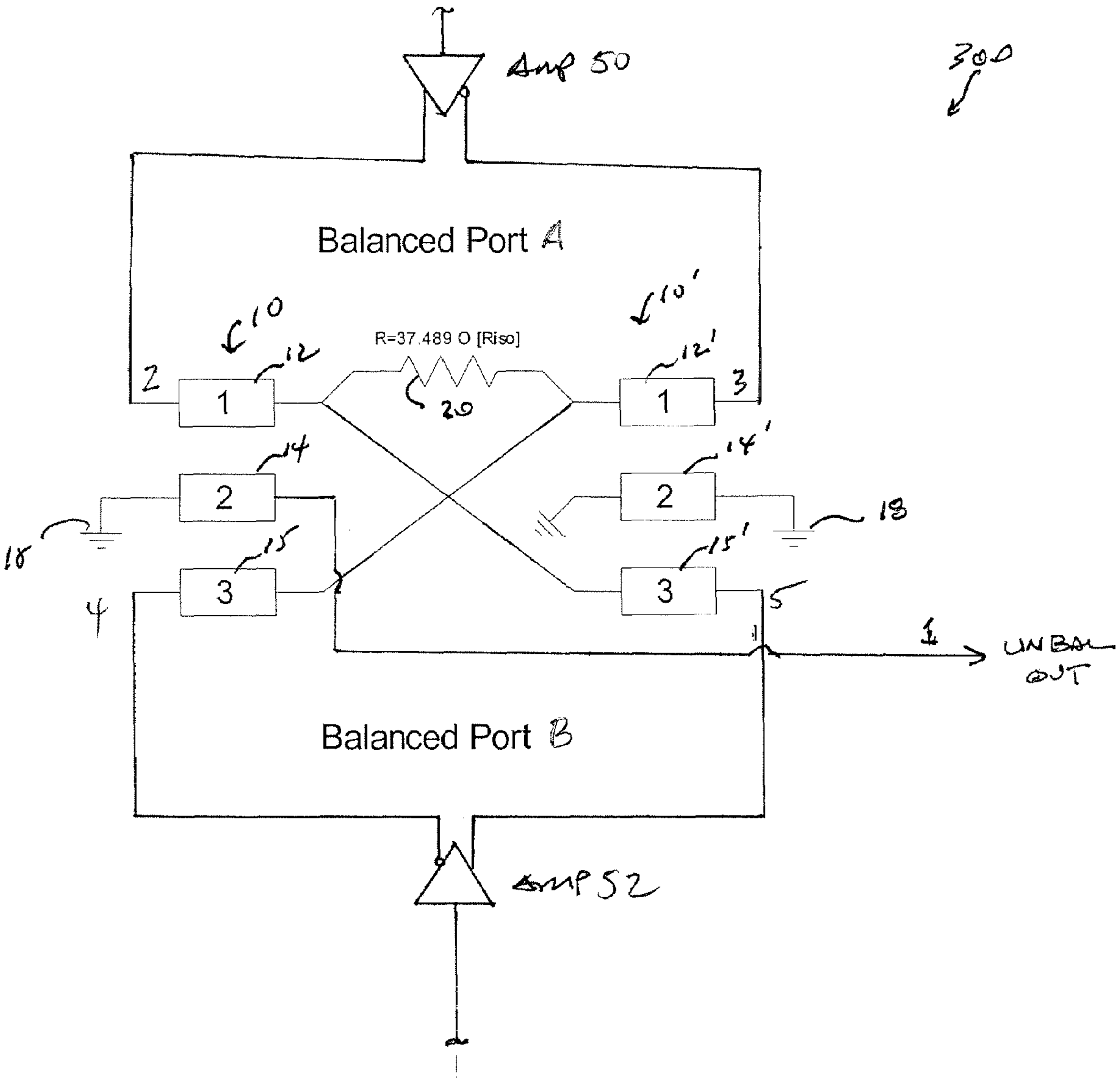
FIG. 19 is a combiner in accordance with yet another embodiment of the present invention.

As embodied herein and depicted in FIG. 19, a combiner 300 in accordance with the present invention is disclosed. The embodiment depicted in FIG. 11 is exactly the same device shown in FIG. 10. The only difference between the two devices is the manner in which they are being used. In the device shown in FIG. 10, an input signal is directed into unbalanced port 1. The signal is split two ways, and a first balanced signal appears at the output of balanced port A and a second balanced signal appears at the output of balanced port B. In FIG. 11, the outputs of differential amplifier 50 are connected to balanced port A (2, 3) and the outputs of differential amplifier B are connected to balanced port B (4, 5). The signals provided by the differential amplifiers (50, 52) are combined and directed to the output at unbalanced port 1.

The combiner of the present invention is advantageous in that if one of the differential amplifiers experiences a fault condition and does not provide a differential input signal, combiner 300 will continue to provide an output signal, albeit at approximately half the magnitude.

Figure 20:
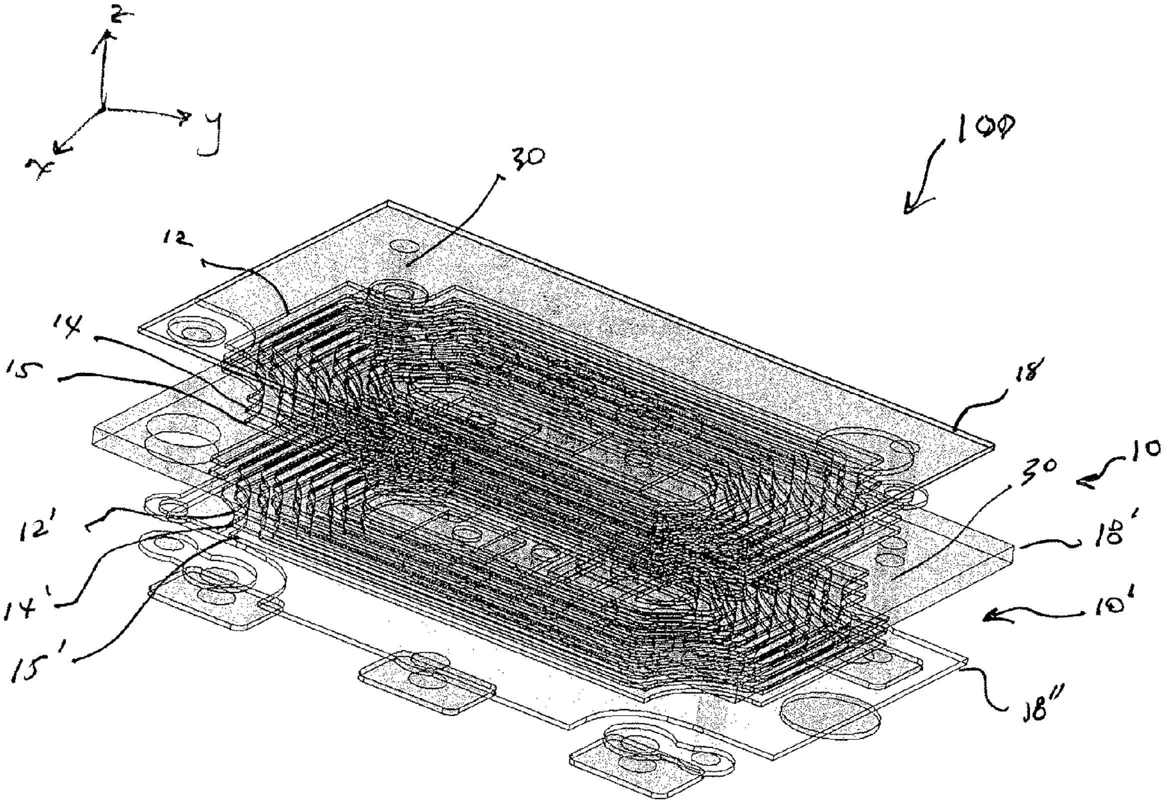
FIG. 20 is a perspective view of the device depicted in either FIG. 6, 10, 13, 18 or 19 in accordance with the present invention.

Referring to FIG. 20, a perspective view of the device depicted in either FIG. 6, 10, 13, 18 or 19 is disclosed. Each of these devices may be implemented by interconnecting vertical interdigital coupler 10 and vertical interdigital coupler 10' within a single compact housing. Coupler 10 occupies the upper-half of the device (100, 200, 300) and coupler 10' is disposed in the bottom portion of device (100, 200, 300). Coupler 10 and coupler 10' share ground plate 18'. Thus, coupler 10 is disposed between ground plate 18 and interior ground plate 18' Coupler 10' is disposed between plate 18' and lower ground plate 18". Note that the device includes interior vias 30 configured to accommodate interior signal transmission paths. Those of ordinary skill in the art will understand that dielectric layers 16 (not shown) are disposed between each transmission line 12, 14, 15 as well as 12', 14', 15'. The dielectric layers 16 are not shown in FIG. 14 for clarity of illustration.

Figure 21:
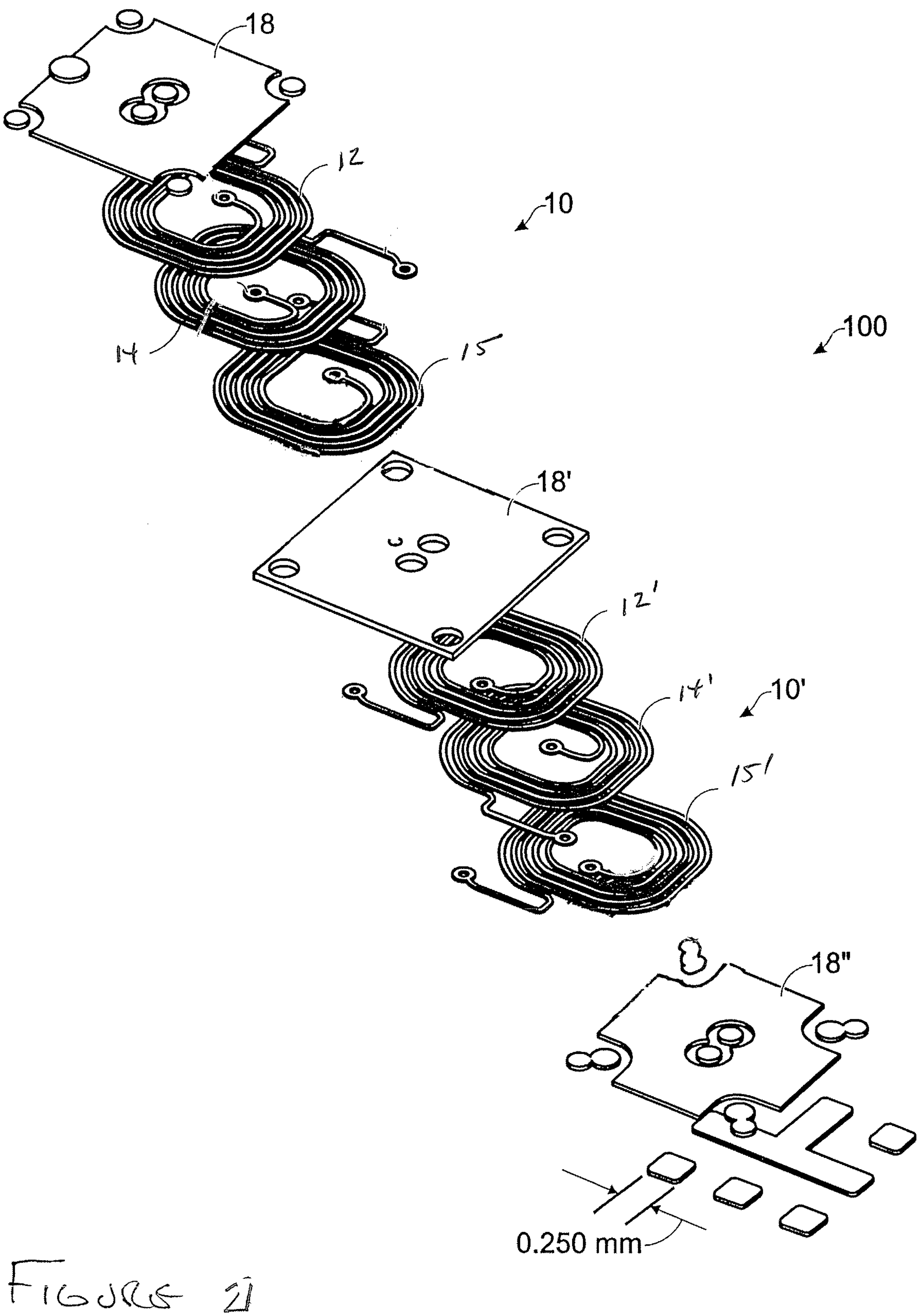
FIG. 21 is an exploded view of the device depicted in either FIG. 6, 10, 13, 18 or 19 in accordance with the present invention.

Referring to FIG. 21, an exploded view of the device depicted in either FIG. 6, 10, 13, 18 or 19 is disclosed without any of the interconnections. Coupler 10 and coupler 10' are identical three-transmission layer devices, i.e., each vertical interdigital coupler 10 (10') includes three coupled transmission lines 12, 14, 15 (12', 14', 15'). Again, each transmission line is disposed on a dielectric substrate 16 (not shown in this view).

In general, each coupler structure (10, 10') of the present invention may be fabricated in the following manner. As an initial step, the geometric configuration, i.e., the shape of the transmission line in plan view, the width of the conductors, the thickness of the conductors, and all the various spacing dimensions have been calculated. Each transmission line layer is provided as a conductive sheet bonded to a dielectric sheet. Subsequently, the predetermined geometric pattern is transferred to the surface of the conductive sheet using photolithographic techniques. A photoresist material is disposed on the conductive sheet and the pattern is transferred to the resist material by directing radiant energy through a mask. The mask, of course, includes the image of the pattern. Imaging optics disposed in the photolithographic system ensure that the line widths transferred to the surface of the photoresist are properly dimensioned within an appropriate tolerance range. Subsequently, the exposed photoresist material and the underlying portion of the conductive sheet are removed by applying an etchant. The etching provides the transmission line layer wherein a transmission line is disposed on a dielectric substrate 16.

With respect to coupler structure 10, transmission line layers 12, 14, and 15 are placed in vertical alignment with each other using a suitable registration method. For example, those of ordinary skill in the art will understand that various keying structures and techniques may be employed to ensure that vertical alignment is effected. After alignment, the transmission line layers 12, 14, 15 are bonded together to form a laminate structure. Again, those of ordinary skill in the art will understand that any suitable bonding technique may be employed depending on the type of dielectric material used to implement dielectric layer 16. For example, with certain polymer dielectric materials, the step of bonding may be performed by applying heat and/or pressure to the sandwiched transmission line layers. After lamination is completed, the transmission line layers are interconnected in accordance with schematic diagrams shown in FIGS. 6, 8, 10, and 11.

Reference is made to U.S. patent application Ser. No. 11/419,091, filed on May 18, 2006, which is incorporated herein by reference as though fully set forth in its entirety, for a more detailed explanation of the vertical interdigital couplers used herein.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the invention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A balun comprising:

a first coupler structure including a first port of a balanced port pair and an unbalanced port;

a second coupler structure including a second port of the balanced port pair, the second coupler structure being connected to the first coupler structure such that the second port of the balanced port pair is DC isolated from the first port of the balanced port pair without decoupling components.

2. The balun of claim 1, wherein the first coupler structure includes a first transmission line layer coupled to a second transmission line layer, and a third transmission line layer coupled to the second transmission layer, the second transmission line layer being sandwiched between the first transmission line layer and the third transmission line layer, and wherein the second coupler structure including a fourth transmission line layer coupled to a fifth transmission line layer, and a sixth transmission line layer coupled to the fifth transmission layer, the fifth transmission line layer being sandwiched between the fourth transmission line layer and the sixth transmission line layer, and wherein the first transmission line layer is connected to the sixth transmission line layer and wherein the third transmission line layer is connected to the fourth transmission line layer.

3. The balun of claim 2, wherein the first port of a balanced port pair is connected to the first transmission line layer and the second port of the balanced port pair is connected to the fourth transmission line layer.

4. The balun of claim 2, wherein the second transmission line layer has a first end connected to ground potential and a second end connected to the unbalanced port.

5. The balun of claim 2, wherein the fifth transmission line is grounded at both ends.

6. The balun of claim 2, wherein each transmission line layer includes a conductive transmission line conforming to a predetermined geometric configuration, the conductive transmission line being disposed on a dielectric material.

7. The balun of claim 6, wherein the predetermined geometric configuration includes a planar pattern (X-Y plane) selected from a group of planar patterns that includes linear planar patterns, non-linear planar patterns, spiral patterns, substantially rectangular patterns.

8. The balun of claim 2, further comprising a resistive element connected between the first transmission line layer and the fourth transmission line layer to form a power combiner/divider structure.

9. The balun of claim 8, wherein the first port of the balanced port pair is connected to the first transmission line layer and the second port of the balanced port pair is connected to the fourth transmission line layer and a first port of a second balanced port pair is connected to the third transmission line and a second port of the second balanced port pair is connected to the sixth transmission line.

10. The balun of claim 1, wherein the first coupler structure and the second coupler structure are each characterized by a physical coupler form factor based on a cross-sectional area, a predetermined geometrical configuration, and a selected coupling constant.

11. The balun of claim 10, wherein the cross-sectional area is proportional to:

$A_N=(s+w)[2h+(N-1)d+Ntm]$; and wherein s is a horizontal spacing between adjacent transmission line conductors, w is a horizontal width of each transmission line conductor, h is a vertical distance from an outermost transmission line conductor to a ground plane, N is a total number of transmission line layers in each of the first coupler structure and the second coupler structure, d is a vertical distance between sandwiched transmission line conductors, t is a vertical thickness of each transmission line conductor, and m is a ratio in a horizontal direction of conducting material to dielectric material.

12. The balun of claim 11, wherein the first coupler structure and the second coupler structure are characterized by a finite even-mode impedance ($Z_e$) and a finite odd-mode impedance ($Z_o$), the ratio ($R=Z_e/Z_o$) being greater than or equal to one (1).

13. The balun of claim 12, wherein $Z_o$ is a function of d, w, s and t.

14. The balun of claim 12, wherein $Z_e$ is a function of at least h.

15. The balun of claim 11, wherein N is equal to three (3).

16. The balun of claim 10, wherein the predetermined geometric configuration is substantially linear.

17. The balun of claim 10, wherein the predetermined geometric configuration includes at least one substantially rectangular geometric pattern.

18. The balun of claim 10, wherein the predetermined geometric configuration is a non-linear geometric configuration.

19. The balun of claim 10, wherein the predetermined geometric configuration includes at least one meandered line segment.

20. The balun of claim 10, wherein the predetermined geometric configuration includes a spiral configuration.

21. The balun of claim 1, wherein the first coupler structure and the second coupler structure are characterized by a finite even-mode impedance ($Z_e$) and a finite odd-mode impedance ($Z_o$), the ratio ($R=Z_e/Z_o$) being greater than or equal to one (1).

22. The balun of claim 1, wherein the first coupler structure is a vertical interdigital coupler structure and the second coupler structure is a vertical interdigital coupler structure.

23. The balun of claim 22, wherein the vertical interdigital coupler structures comprise broadside couplers.

24. The balun of claim 1, wherein the first coupler structure is a vertical interdigital coupler structure and the second coupler structure comprise edge-coupled structures.

25. A balun comprising:

a first coupler structure including a first port of a balanced port pair and an unbalanced port; and a second coupler structure including a second port of the balanced port pair, the second coupler structure being connected to the first coupler structure such that the first port of the balanced port pair and the second port of the balanced port pair are isolated from ground potential without decoupling components.

26. The balun of claim 25, wherein the first coupler structure includes a first transmission line layer coupled to a second transmission line layer, and a third transmission line layer coupled to the second transmission layer, the second transmission line layer being sandwiched between the first transmission line layer and the third transmission line layer, and wherein the second coupler structure including a fourth transmission line layer coupled to a fifth transmission line layer, and a sixth transmission line layer coupled to the fifth transmission layer, the fifth transmission line layer being sandwiched between the fourth transmission line layer and the sixth transmission line layer, and wherein the first transmission line layer is connected to the third transmission line layer and the fourth transmission line layer and wherein the fourth transmission line layer is also connected to the sixth transmission line layer.

27. The balun of claim 26, wherein the first port of a balanced port pair is connected to the first transmission line layer and the second port of the balanced port pair is connected to the fourth transmission line layer.

28. The balun of claim 26, wherein the second transmission line layer has a first end connected to ground potential and a second end connected to the unbalanced port.

29. The balun of claim 26, wherein the fifth transmission line is grounded at both ends.

30. The balun of claim 25, wherein the first coupler structure includes a first transmission line layer coupled to a second transmission line layer, and a third transmission line layer coupled to the second transmission layer, the second transmission line layer being disposed between the first transmission line layer and the third transmission line layer, and wherein the second coupler structure including a fourth transmission line layer coupled to a fifth transmission line layer, and a sixth transmission line layer coupled to the fifth transmission layer, the fifth transmission line layer being disposed between the fourth transmission line layer and the sixth transmission line layer, and wherein the first transmission line layer is connected to the third transmission line layer and wherein the fourth transmission line layer is also connected to the sixth transmission line layer.

31. The balun of claim 30, wherein the first port of a balanced port pair is connected to the second transmission line layer and the second port of the balanced port pair is connected to the fifth transmission line layer, and wherein the second transmission line layer is connected to the fifth transmission line layer.

32. The balun of claim 30, wherein the first transmission line layer and the third transmission line layer have a first end connected to ground potential and a second end connected to the unbalanced port.

33. The balun of claim 30, wherein the fourth transmission line layer and the sixth transmission lines layer are grounded at both ends.

34. A device configured to operate within a predetermined band of frequencies, the device comprising:

a first coupler structure including a first portion of a first balanced port, a first port of a second balanced port and an unbalanced port;

a resistive element connected to the first coupler structure; and a second coupler structure including a second portion of the first balanced port and a second portion of the second balanced port, the second coupler structure being connected to the first coupler structure by way of the resistive element such that the first and second portions of the first balanced port pair and the first and second portions of the second balanced port pair are isolated from each other substantially within the predetermined band without decoupling components.

35. The device of claim 34, wherein the first coupler structure includes a first transmission line layer coupled to a second transmission line layer and a third transmission line layer coupled to the second transmission layer, the second transmission line layer being disposed between the first transmission line layer and the third transmission line layer, the second coupler structure including a fourth transmission line layer coupled to a fifth transmission line layer and a sixth transmission line layer coupled to the fifth transmission layer, the fifth transmission line layer being disposed between the fourth transmission line layer and the sixth transmission line layer, the first transmission line layer being connected to the sixth transmission line layer and the third transmission line layer being connected to the fourth transmission line layer.

36. The device of claim 35, wherein the first portion of the first balanced port pair is connected to the first transmission line layer and the second portion of the first balanced port pair is connected to the fourth transmission line layer.

37. The device of claim 35, wherein the first portion of the second balanced port pair is connected to the third transmission line layer and the second portion of the second balanced port pair is connected to the sixth transmission line layer.

38. The device of claim 35, wherein the resistive element is disposed between the first transmission line layer and the fourth transmission line layer.

39. The device of claim 35, wherein the second transmission line layer has a first end connected to ground potential and a second end connected to the unbalanced port.

40. The device of claim 35, wherein the fifth transmission line is grounded at both ends.

41. The device of claim 34, wherein the sum of the signal power of the first balanced port and the signal power of the second balanced port is substantially equal to the signal power of the unbalanced port.

42. The device of claim 34, wherein the unbalanced port is configured as an input port and the first balanced port and the second balanced port are configured as output ports.

43. The device of claim 34, wherein the unbalanced port is configured as an output port and the first balanced port and the second balanced port are configured as input ports.

44. A balun comprising:

a first coupler structure including a first port of a balanced port pair and an unbalanced port, the first coupler structure includes a first transmission line layer coupled to a second transmission line layer and a third transmission line layer coupled to the second transmission layer, the second transmission line layer being disposed between the first transmission line layer and the third transmission line layer;

a second coupler structure including a second port of the balanced port pair, the second coupler structure also including a fourth transmission line layer coupled to a fifth transmission line layer and a sixth transmission line layer coupled to the fifth transmission layer, the fifth transmission line layer being disposed between the fourth transmission line layer and the sixth transmission line layer, the first transmission line layer being connected to the sixth transmission line layer and the third transmission line layer being connected to the fourth transmission line layer such that the first port of the balanced port pair is DC isolated from the second port of the balanced port pair.

45. The balun of claim 44, wherein the first port of a balanced port pair is connected to the first transmission line layer and the second port of the balanced port pair is connected to the fourth transmission line layer.

46. The balun of claim 44, wherein the second transmission line layer has a first end connected to ground potential and a second end connected to the unbalanced port.

47. The balun of claim 44, wherein the fifth transmission line is grounded at both ends.

48. The balun of claim 44, wherein the first port of the balanced port pair is DC isolated from the second port of the balanced port pair without decoupling components.

49. The balun of claim 44, wherein each transmission line layer includes a conductive transmission line disposed on a dielectric material.

50. The balun of claim 44, wherein the first coupler structure and the second coupler structure are arranged as vertically interdigital coupler structures.

* * * * *